(12) United States Patent
Moon et al.

(10) Patent No.: US 10,910,586 B2
(45) Date of Patent: Feb. 2, 2021

(54) LIGHTING APPARATUS USING ORGANIC LIGHT EMITTING DIODE

(71) Applicant: LG Display Co., Ltd., Seoul (KR)

(72) Inventors: Youngkyun Moon, Seoul (KR); JinBok Lee, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/516,565

(22) Filed: Jul. 19, 2019

(65) Prior Publication Data

US 2020/0028111 A1 Jan. 23, 2020

(30) Foreign Application Priority Data

Jul. 23, 2018 (KR) ........................ 10-2018-0085193

(51) Int. Cl.
| | |
|---|---|
| *H01L 51/52* | (2006.01) |
| *H01L 27/32* | (2006.01) |
| *H01L 51/00* | (2006.01) |
| *H01L 51/50* | (2006.01) |

(52) U.S. Cl.
CPC ...... *H01L 51/5212* (2013.01); *H01L 27/3202* (2013.01); *H01L 51/0097* (2013.01); *H01L 51/504* (2013.01); *H01L 51/5221* (2013.01); *H01L 51/5237* (2013.01); *H01L 51/5268* (2013.01); *H01L 2251/5338* (2013.01); *H01L 2251/5361* (2013.01); *H01L 2251/5392* (2013.01)

(58) Field of Classification Search
CPC . H01L 51/50–56; H01L 51/0032–0095; H01L 27/3202–3204; H01L 27/3209; H01L 27/3225–3234
See application file for complete search history.

(56) References Cited

U.S. PATENT DOCUMENTS

| | | | | |
|---|---|---|---|---|
| 8,653,553 | B2* | 2/2014 | Yamazaki | H01L 51/504 257/98 |
| 2005/0225234 | A1* | 10/2005 | Tyan | H01L 51/5088 313/504 |
| 2007/0200492 | A1* | 8/2007 | Cok | H01L 51/5284 313/506 |
| 2016/0293888 | A1* | 10/2016 | Shim | H01L 51/5228 |

FOREIGN PATENT DOCUMENTS

| | | |
|---|---|---|
| KR | 10-2006-0010355 A | 2/2006 |
| KR | 10-2016-0007890 A | 1/2016 |
| KR | 10-2016-0108799 A | 9/2016 |

* cited by examiner

*Primary Examiner* — Jonathan Han
(74) *Attorney, Agent, or Firm* — Polsinelli PC

(57) ABSTRACT

A lighting apparatus including organic light-emitting diodes comprises an anode disposed in an emission area of a substrate; first and second pad electrodes disposed on an outer side of the emission area of the substrate; a short-circuit reduction pattern surrounding an emission zone of each of pixels and formed by removing a part of the anode; a passivation layer comprising the short-circuit reduction pattern and disposed on the anode; an organic layer and a cathode disposed on the passivation layer in the emission area of the substrate; and a metal film disposed in the emission area of the substrate, wherein the short-circuit reduction pattern has a gradually-reducing resistance with an increased distance between the pixels and the first and second pad electrodes.

20 Claims, 21 Drawing Sheets

LIGHTING APPARATUS USING ORGANIC LIGHT EMITTING DIODE

CROSS-REFERENCE TO RELATED APPLICATION

This application claims the priority of Korean Patent Application No. 10-2018-0085193 filed on Jul. 23, 2018, in the Korean Intellectual Property Office, which is incorporated by in its entirety reference.

BACKGROUND

Field of the Disclosure

The present disclosure relates to a lighting apparatus, and more particularly to a lighting apparatus using organic light-emitting diodes.

Description of the Background

Fluorescent lamps or incandescent lamps are currently used as lighting apparatuses. Incandescent lamps have good color rendering index (CRI) but have very low energy efficiency. Fluorescent lamps have good energy efficiency but have low CRI and contain mercury, which results in environmental problems.

A CRI is a quantitative measure of the ability of a light source to reveal the colors of various objects faithfully in comparison with an ideal or natural light source. The CRI of sunlight is 100.

To overcome such problems of the existing lighting apparatuses, light-emitting diodes (LEDs) have been proposed as lighting apparatuses. A light-emitting diode is made of an inorganic light-emitting material and has the highest luminous efficiency in the red wavelength range, and the luminous efficiency decreases toward the green wavelength range that has the highest luminosity factor with red. Therefore, when white light is emitted by combining a red light-emitting diode, a green light-emitting diode, and a blue light-emitting diode, the luminous efficiency is lowered.

As another alternative, a lighting apparatus using organic light-emitting diodes (OLED) is being developed. In a lighting apparatus using organic light-emitting diodes, an anode made of ITO is formed on a glass substrate. Then, an organic layer and a cathode are formed on the anode, and a protective layer and a lamination film are formed thereon.

Existing lighting apparatus using organic light-emitting diodes have problems that electrical current is concentrated in a region close to the pad electrodes so that the luminance is increased, and that voltage drop (IR drop) occurs as the distance increases away from the pad electrodes such that the luminance uniformity deteriorates.

SUMMARY

The present disclosure is to provide a lighting apparatus using organic light-emitting diodes that prevents the existing problem that the overall luminance of the panel is lowered when a short-circuit occurs.

In addition, the present disclosure is to provide a lighting apparatus using organic light-emitting diodes that can maintain the luminance uniformity regardless of distance from pad electrodes.

Further, the present disclosure is not limited to the above-mentioned aspects and can be clearly understood by those skilled in the art from the following descriptions.

According to an aspect of the present disclosure, there is provided a lighting apparatus using organic light-emitting diodes, including: an anode disposed in an emission area of a substrate; first and second pad electrodes disposed on an outer side of the emission area of the substrate; a short-circuit reduction pattern formed by removing a predetermined part of the anode and surrounding an emission zone of each of pixels; a passivation layer comprising the short-circuit reduction pattern and disposed on the anode; an organic layer and a cathode disposed on the passivation layer in the emission area of the substrate; and a metal film disposed in the emission area of the substrate, wherein the short-circuit reduction pattern has a gradually-reducing resistance as a distance between the respective pixels and the first and second pad electrodes increases.

According to an aspect of the present disclosure, there is provided a lighting apparatus using organic light-emitting diodes including: an anode disposed in an emission area of a substrate; first and second pad electrodes disposed on an outer side of the emission area of the substrate; a short-circuit reduction pattern formed by removing a predetermined part of the anode and surrounding an emission zone of each of pixels; a passivation layer comprising the short-circuit reduction pattern and disposed on the anode; an organic layer and a cathode disposed on the passivation layer in the emission area of the substrate; and a metal film disposed in the emission area of the substrate, wherein the short-circuit reduction pattern has different resistances depending on a distance between the respective pixels and the first and second pad electrodes to compensate for a voltage drop due to the distance.

Other detailed matters of the exemplary aspects are included in the detailed description and the drawings.

According to an exemplary aspect of the present disclosure, the luminance uniformity can be improved by compensating for a voltage drop that occurs as the distance from the pad electrodes increases. Accordingly, as the luminance uniformity can be improved, the lifetime can be elongated and the quality of the exterior can be improved.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
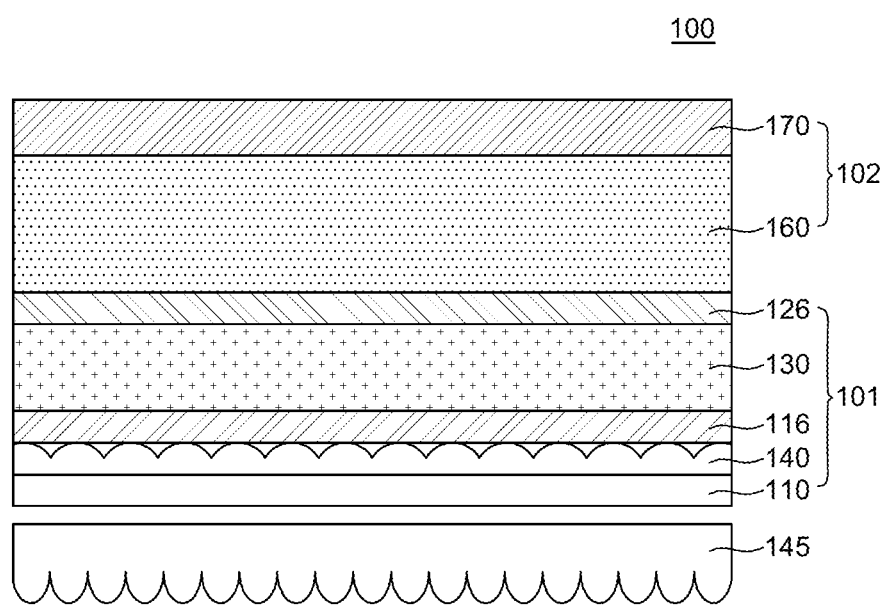
FIG. 1 is a cross-sectional view showing an example of a lighting apparatus using organic light-emitting diodes according to a first exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereafter, various aspects of the present disclosure will be described in detail with reference to the accompanying drawings.

Hereinafter, exemplary aspects of the present disclosure will be described in detail with reference to the accompanying drawings.

FIG. 1 is a cross-sectional view showing an example of a lighting apparatus using organic light-emitting diodes according to a first exemplary aspect of the present disclosure.

Figure 2:
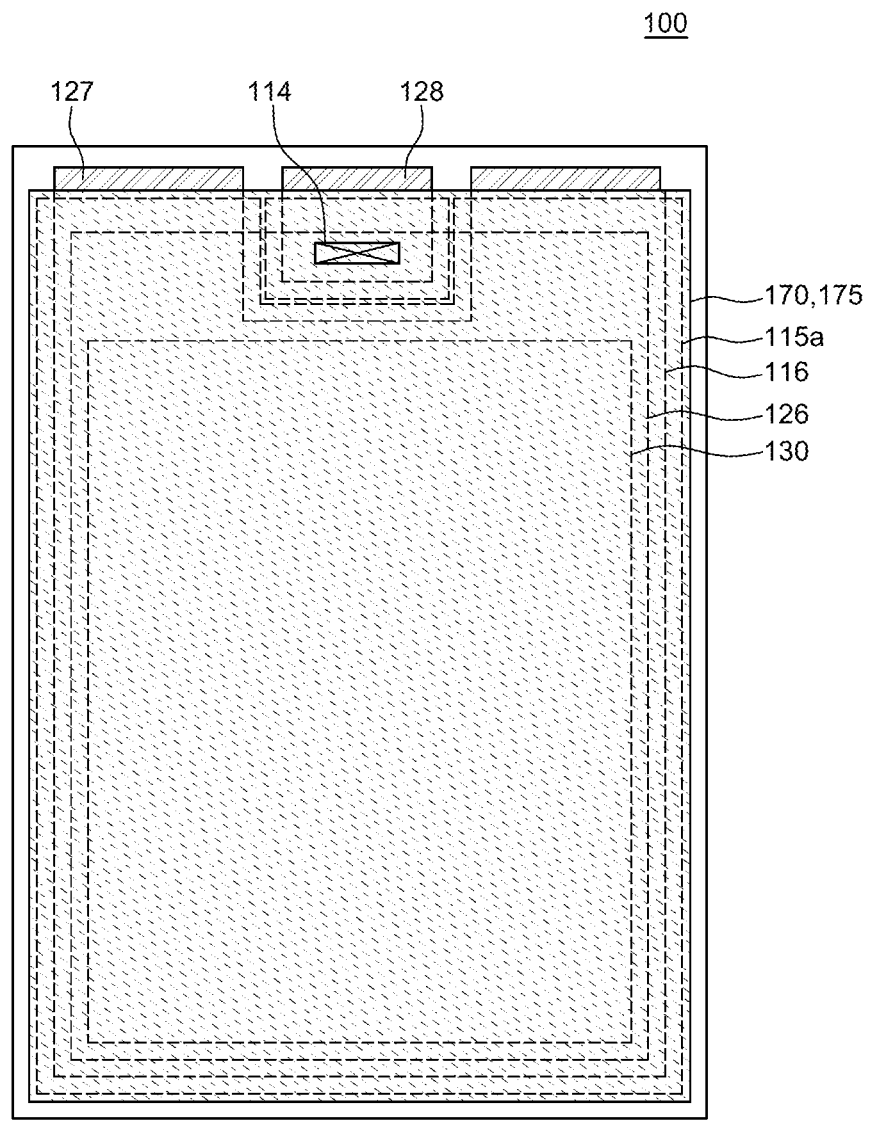
FIG. 2 is a plan view showing an example of the lighting apparatus using organic light-emitting diodes according to the first exemplary aspect of the present disclosure.

FIG. 2 is a plan view showing an example of the lighting apparatus using organic light-emitting diodes according to the first exemplary aspect of the present disclosure.

Figure 3:
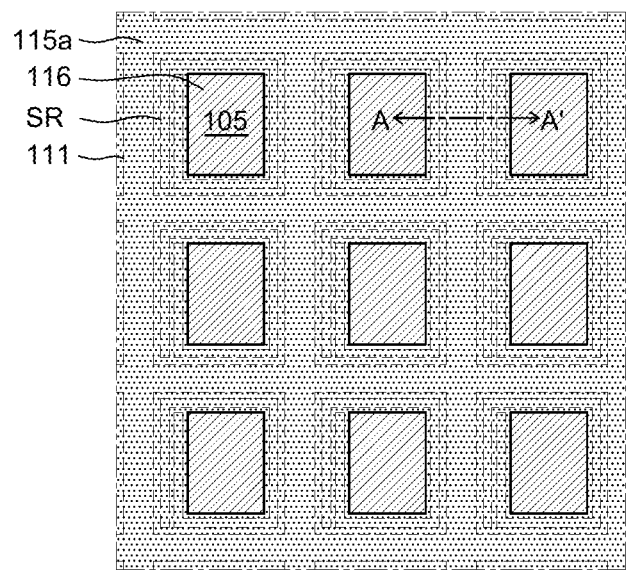
FIG. 3 is an enlarged view showing a part of an emission area shown in FIG. 2.
Figure 4:
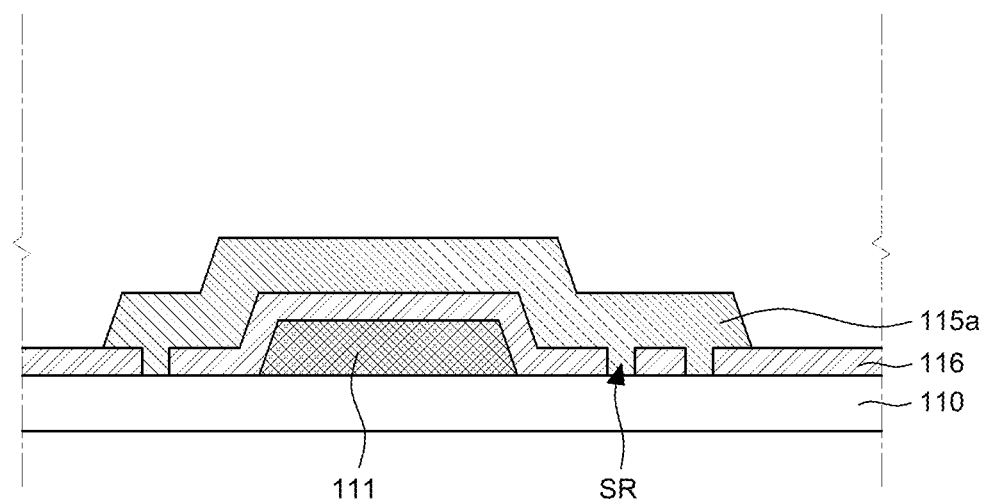
FIG. 4 is a cross-sectional view showing a part of the emission area, taken along line A-A' of FIG. 3.

FIG. 3 is an enlarged view showing a part of an emission area shown in FIG. 2. FIG. 4 is a cross-sectional view showing a part of the emission area, taken along line A-A' of FIG. 3.

According to an exemplary aspect of the present disclosure, a lighting apparatus using organic light-emitting diodes made of an organic material is provided, instead of a lighting apparatus using inorganic light-emitting diodes made of an inorganic material.

An organic light-emitting diode made of an organic light-emitting material exhibits a better luminous efficiency of green and red light than an inorganic light-emitting diode. In addition, since organic light-emitting diodes have larger widths of the emission peak of red, green and blue light than those of the inorganic light-emitting diodes, the CRI is improved, so that there is an advantage that the light emitted from the lighting apparatus become more similar to the sunlight.

In the following description, a flexible lighting apparatus is described as a lighting apparatus according to an exemplary aspect of the present disclosure as an example. It is, however, to be understood that the present disclosure can be equally applied to typical lighting apparatuses as well.

Specifically, referring to FIGS. 1 to 3, a lighting apparatus 100 using organic light-emitting diodes according to the first exemplary aspect of the present disclosure may include an organic light-emitting diode unit 101 where surface light-emitting occurs, and an encapsulation unit 102 for encapsulating the organic light-emitting diode unit 101.

An outer light extraction layer 145 may be further disposed under the organic light-emitting diode unit 101 to increase haze. It is, however, to be understood that the present disclosure is not limited thereto, and the outer light extraction layer may be eliminated.

The external light extraction layer 145 may be formed by dispersing scattering particles such as $TiO_2$ in a resin and may be attached under a substrate 110 by an adhesive layer (not shown).

The organic light-emitting diode unit 101 may include an organic light-emitting diode disposed on the substrate 110, and an inner light extraction layer 140 may be further disposed between the substrate 110 and the organic light-emitting diode. It is, however, to be understood that the present disclosure is not limited thereto, and the inner light extraction layer may be eliminated.

A barrier layer (not shown) may be further disposed on the inner light extraction layer 140.

For example, the lighting apparatus 100 according to the exemplary aspect of the present disclosure may include an emission area where light is actually emitted and output to the outside, and first and second pad areas where first and second pad electrodes 127 and 128 are connected to an external device, respectively, to apply signals to the emission area.

The first and second pad areas PA1 and PA2 are not covered by the sealing means of a metal film 170 and/or a protective film 175 and thus can be electrically connected to an external device through the pad electrodes 127 and 128, respectively. Therefore, the metal film 170 and/or the protective film 175 may be attached to the entire surface of the emission area of the substrate 110 except for the first and second pad areas. It is, however, to be understood that the present disclosure is not limited thereto.

A passivation layer 115*a*, an organic layer 130 and a cathode 126 are not formed in the first and second pad areas outside the emission area, and thus the first and second pad electrodes 127 and 128 may be exposed to the outside. A second passivation layer of an organic material and a third passivation layer of an inorganic material (not shown) may be further formed in the emission area so as to cover the organic layer 130 and the cathode 126. It is, however, to be understood that the present disclosure is not limited thereto.

A part of the first passivation layer 115*a* on the second pad electrode 128 located in the emission area may be removed, such that a contact hole 114 for exposing the second pad electrode 128 may be formed. Accordingly, the cathode 126 may be electrically connected to the second pad electrode 128 through the contact hole 114.

The first and second pad areas may be located outside the emission area. Although the second pad area is located between the first pad areas in the example shown in FIG. 2, the present disclosure is not limited thereto.

In addition, FIG. 2 shows an example where the pad areas are located only on one outer side of the emission area, but the present disclosure is not limited thereto. In other implementations, the first and second pad areas may be located on both outer sides of the emission area. In addition, the first pad areas may be located on one outer side of the emission area while second pad area may be located on another outer side of the emission area.

Subsequently, the organic light-emitting diode unit 101 will be described in detail. An anode 116 and a cathode 126 are disposed on the substrate 110, and the organic layer 130 is disposed between the anode 116 and the cathode 126, to form an organic light-emitting diode (OLED).

In addition, the organic light-emitting diode unit 101 may further include an auxiliary line 111 for supplementing the conductivity of the anode 116, and the first passivation layer 115*a* for preventing a short-circuit between the anode 116 and the cathode 126.

Specifically, the substrate 110 may be made of transparent glass. In addition, the substrate 110 may be made of a polymer material having a flexibility such as polyimide (PI).

The anode 116 may supply holes to the organic layer 130 while the cathode 126 may supply electrons to the organic layer 130. It is, however, to be understood that the present disclosure is not limited thereto. The anode 116 and the cathode 126 may have different roles.

The anode 116 may be formed of indium tin oxide (ITO) or indium zinc oxide (IZO), which is a transparent metal oxide material having a high work function and high conductivity to facilitate injection of holes into the organic layer 130.

The anode 116 may be divided into a first anode in an emission zone 105 and a second anode in a non-emission zone other than the emission zone 105.

The second anode may be disposed on the auxiliary line 111 to cover it. The first anode may be formed in the emission zone 105 defined by the auxiliary line 111 in a mesh shape.

The cathode 126 may be made of a conductive material having a low work function to facilitate injection of electrons into the organic layer 130. Examples of the material of the cathode 126 may include a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 130 may be made up of a single stack structure including a red organic emissive layer, a multi-stack tandem structure including a plurality of red organic emissive layers, or a multi-stack tandem structure including red/organic green light-emissive layers and a sky-blue organic emissive layer. It is, however, to be understood that the organic layer 130 of the present disclosure is not limited to the above-described structure, and various structures may be employed.

The organic layer 130 may further include an electron injection layer and a hole injection layer for injecting electrons and holes, respectively, into the organic emissive layer, an electron transport layer and a hole transport layer for transporting the injected electrons and holes, respectively, to the organic emissive layer, and a charge generation layer for generating charges such as electrons and holes.

As described above, when electric current is applied to the anode 116 and the cathode 126, electrons are injected into the organic layer 130 from the cathode 126 while holes are injected from the anode 116 into the organic layer 130. Thereafter, excitons are generated in the organic layer 130. As the excitons decay, light is generated, which is equal to the energy difference between the lowest unoccupied molecular orbital (LUMO) and the highest occupied molecular orbital (HOMO).

The light generated in the organic layer 130 may travel upward (top-emission) or downward (bottom-emission-) depending on the transmittance and reflectance of the anode 116 and the cathode 126.

For example, when the anode 116 is a transparent electrode while the cathode 126 is a reflective electrode, the light generated in the organic layer 130 is reflected by the cathode 126 to be transmitted through the anode 116, such that the light exits through the bottom of the organic light-emitting diode unit 101. That is to say, the organic light-emitting diode unit 101 is of the bottom-emission type. It is, however, to be understood that the present disclosure is not limited thereto. When the anode 116 is a reflective electrode while the cathode 126 is a transparent electrode, the organic light-emitting diode unit 101 may be of the top-emission type.

A buffer layer may be disposed under the anode 116 to block moisture and air permeating through the substrate 110 and the inner light extraction layer 140. To this end, the buffer layer 240 may be made up of a single layer of an inorganic material such as silicon oxide (SiOx) and silicon nitride (SiNx) or a composite layer of an inorganic material and an organic material as desired.

For example, the inner light extraction layer 140 may be disposed between the substrate 110 and the barrier layer to increase the efficiency of extracting light generated from the organic light emitting device to the outside.

The internal light extraction layer 140 can increase the light extraction efficiency by increasing the internal light scattering and increasing the surface roughness by way of inserting titanium dioxide (TiO$_2$) particles into the resin. For example, the inner light extracting layer 140 may be by inkjet-coating so that it has the thickness of 450 nm, and the diameter of the TiO$_2$ particles may range from 200 nm to 300 nm. It is to be noted that such specific numerical values may vary depending on the design choice of the lighting apparatus 100.

Next, the encapsulation unit 102 may cover the organic light-emitting diode unit 101 and block external influences to protect the organic light-emitting diode unit 101. The encapsulation unit 102 may include an adhesive layer 160 in contact with the cathode 126, the metal film 170 in contact with the adhesive layer 160 and the protective film 175 attached to the metal film 170.

The adhesive layer 160 may be implemented as a pressure sensitive adhesive (PSA) for attaching the metal film 170 to the organic light-emitting diode unit 101. The thickness of the adhesive layer 160 may be approximately 30 μm. It is, however, to be understood that the present disclosure is not limited thereto, and the thickness may vary depending on the design choice of the lighting apparatus 100.

The metal film 170 is disposed on the adhesive layer 160 and serves to maintain the rigidity of the lighting apparatus 100. To this end, the metal film 170 may be formed of copper (Cu) having a thickness of approximately 20 μm. It is, however, to be understood that the present disclosure is not limited thereto, but the thickness may vary depending on the design choice of the lighting apparatus 100.

The protective film 175 may be disposed on the metal film 170 to absorb external impact to protect the lighting apparatus 100. To this end, the protective film 175 may be implemented as a polyethylene terephthalate (PET) having a thickness of approximately 100 μm, which is a polymer film. It is, however, to be understood that the present disclosure is not limited thereto, but the protective film 175 may be modified depending on the design choice of the lighting apparatus 100.

Incidentally, in the lighting apparatus using organic light-emitting diodes, when a short-circuit occurs between the anode and the cathode due to particles, a current drop occurs across the entire panel, such that the overall luminance of the panel as well as the pixel where the short-circuit occurs may be lowered.

In view of the above, in the lighting apparatus 100 according to the first exemplary aspect of the present disclosure, a short-circuit reduction pattern SR is formed on the anode 116 to which current is supplied in each of the pixels to reflect a narrow path. The short-circuit reduction pattern SR is covered with the first passivation layer 115a to prevent a short-circuit in the entire panel. That is to say, the short-circuit reduction pattern SR surrounds the emission zone 105 of each of the pixels. The current flowing to a short-circuit occurring area is limited by adding the resistance in each of the pixels in this manner.

The short-circuit reduction pattern SR may be in the shape of an open curve surrounding the border of the emission zone 105. In addition, the short-circuit reduction pattern SR may be a combination of straight lines or may include a curved line.

In addition, the short-circuit reduction pattern SR penetrates the anode 116 vertically, and may be filled with the first passivation layer 115a.

In the example shown in FIGS. 3 and 4, one straight line of the short-circuit reduction pattern SR is disposed on one side of the auxiliary line 111 while two straight lines of the short-circuit reduction pattern SR are disposed on the other side thereof. It is, however, to be understood that the present disclosure is not limited thereto.

In the lighting apparatus 100 according to the first exemplary aspect of the present disclosure, the short-circuit reduction pattern SR is formed substantially in the same manner in every pixel in the panel.

Figure 5:
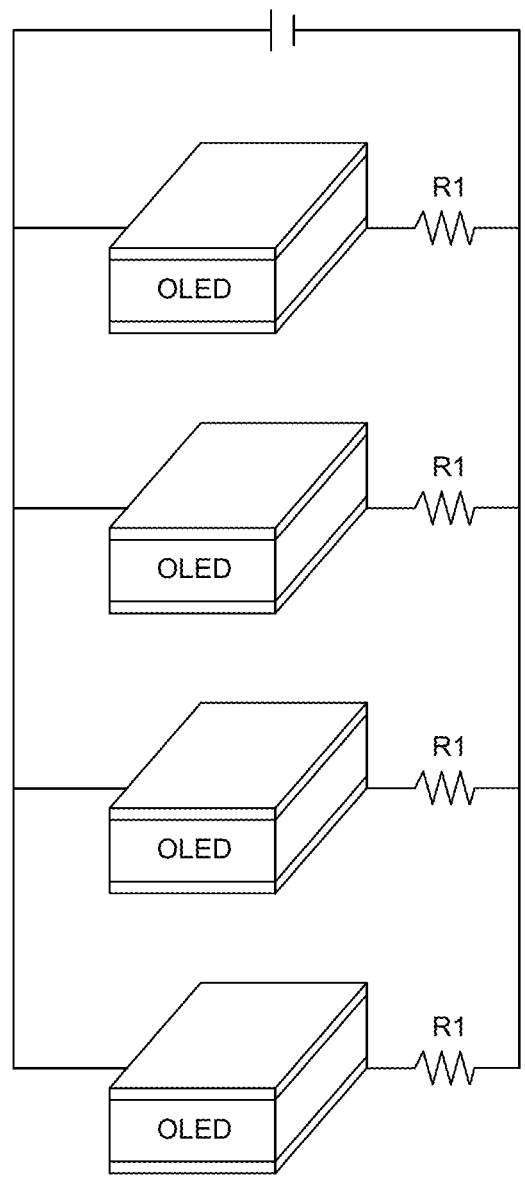
FIG. 5 is a schematic circuit diagram showing a lighting apparatus using organic light-emitting diodes according to the first exemplary aspect of the present disclosure.

FIG. 5 is a schematic circuit diagram showing a lighting apparatus using organic light-emitting diodes according to the first exemplary aspect of the present disclosure.

Figure 6:
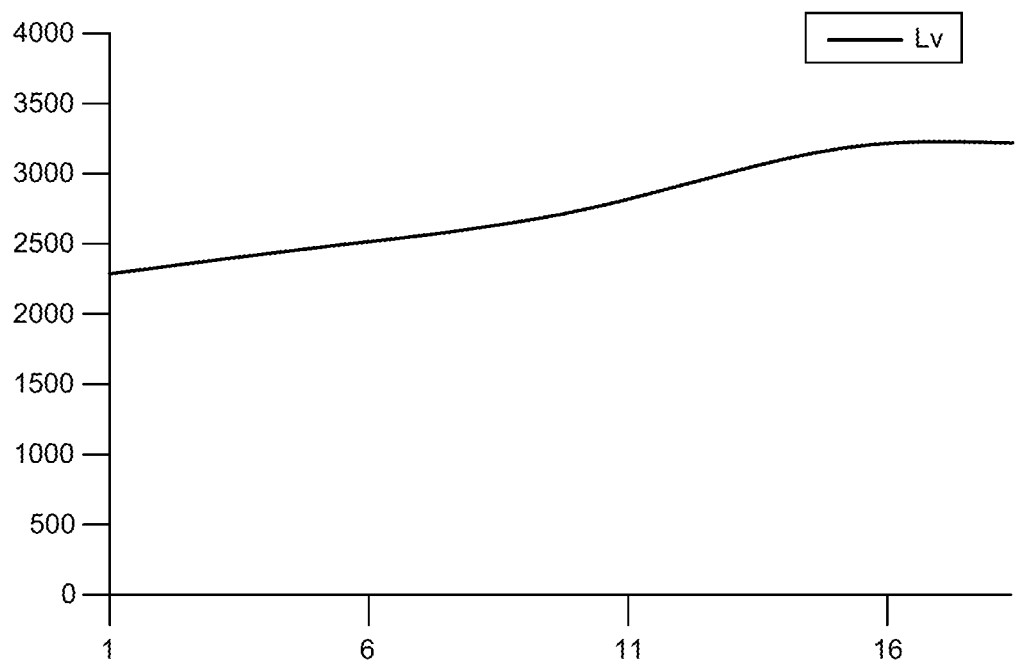
FIG. 6 is a graph showing a change in luminance depending on locations of pixels in a lighting apparatus using organic light-emitting diodes according to the first exemplary aspect of the present disclosure.

FIG. 6 is a graph showing a change in luminance depending on the locations of pixels in a lighting apparatus using organic light-emitting diodes according to the first exemplary aspect of the present disclosure. Specifically, FIG. 6 shows the luminance characteristics for a row according to the distance from the end where electrical current is supplied.

Referring to FIG. 5, in the lighting apparatus using the organic light-emitting diodes according to the first exemplary aspect, a plurality of pixels is disposed in the panel, and each of the pixels includes an organic light-emitting diode OLED including an anode, an organic layer and a cathode.

It can be seen that the organic light-emitting diodes OLED are arranged in parallel with different distances from the end where electric current is supplied, for example, the pad electrode.

In each of the organic light-emitting diodes OLED, the short-circuit reduction pattern is formed to surround the border of the emission zone of each of the pixels. A resistance R1 is additionally connected in series to each of the pixels to limit a current flowing to a short-circuit occurring area.

It can be seen that the resistance R1 of the short-circuit reduction pattern is designed substantially in the same manner in each of the pixels in the panel irrespective of the distance from the end where electric current is supplied, for example, the pad electrode.

In this instance, it can be seen from FIG. 6 that the current is concentrated in the region close to the pad electrode and accordingly the luminance increases. For example, it can be seen that the luminance of the pixel farthest from the pad electrode is approximately 2,297 cd/m$^2$, whereas the luminance of the pixel closest to the pad electrode is approximately 3,510 cd/m$^2$.

As such, it can be seen that the current is concentrated in the region close to the pad electrode so that the luminance increases, and the luminance uniformity deteriorates due to the voltage drop (IR Drop) as the distance from the pad electrode increases.

This phenomenon becomes more serious for a larger panel. In addition, the lifetime and quality of the organic light emitting diode OLED may deteriorate as the luminance uniformity deteriorates.

In view of the above, according to second to fourth exemplary aspects of the present disclosure, a voltage drop is compensated for by varying the resistance of the short-circuit reduction pattern depending on the distance from the pad electrodes in each of the pixels in the panel, thereby improving the luminance uniformity of a lighting apparatus.

Figure 7:
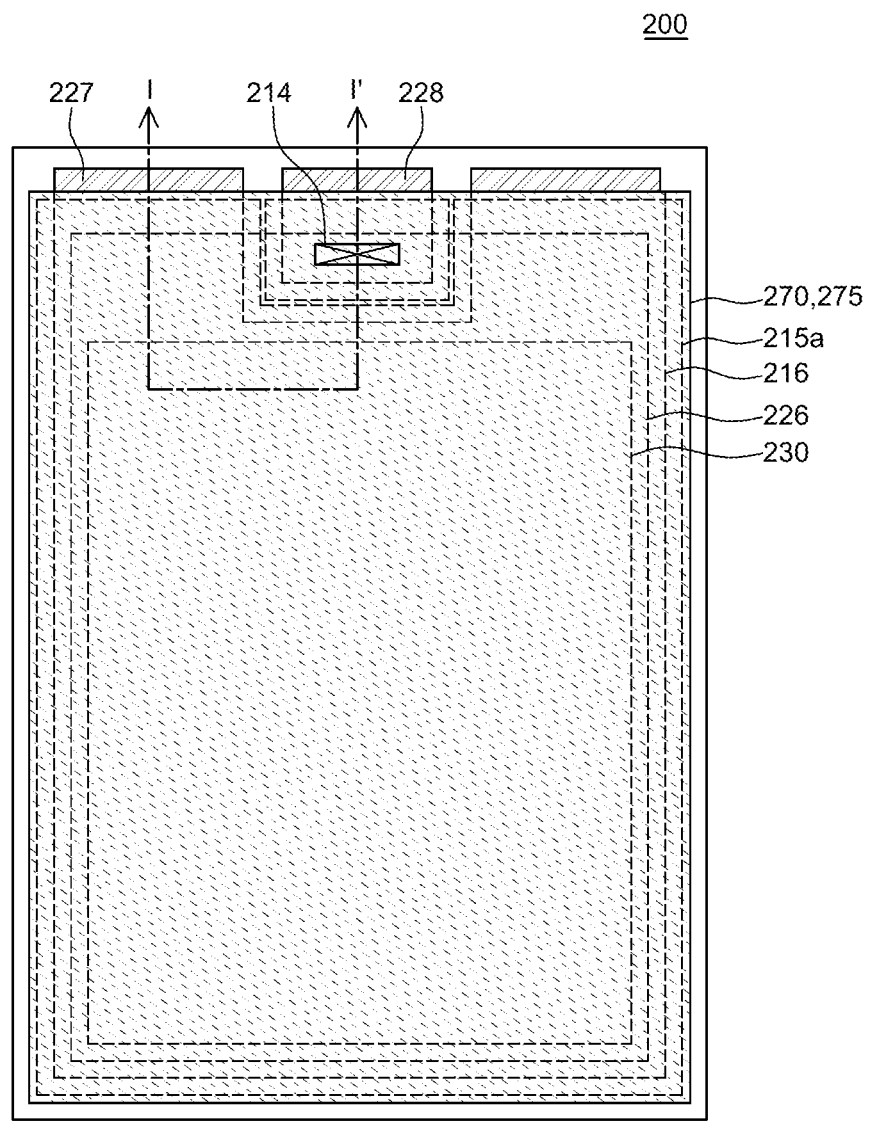
FIG. 7 is a plan view showing an example of the lighting apparatus using organic light-emitting diodes according to a second exemplary aspect of the present disclosure.

FIG. 7 is a plan view showing an example of the lighting apparatus using organic light-emitting diodes according to the second exemplary aspect of the present disclosure.

Figure 8:
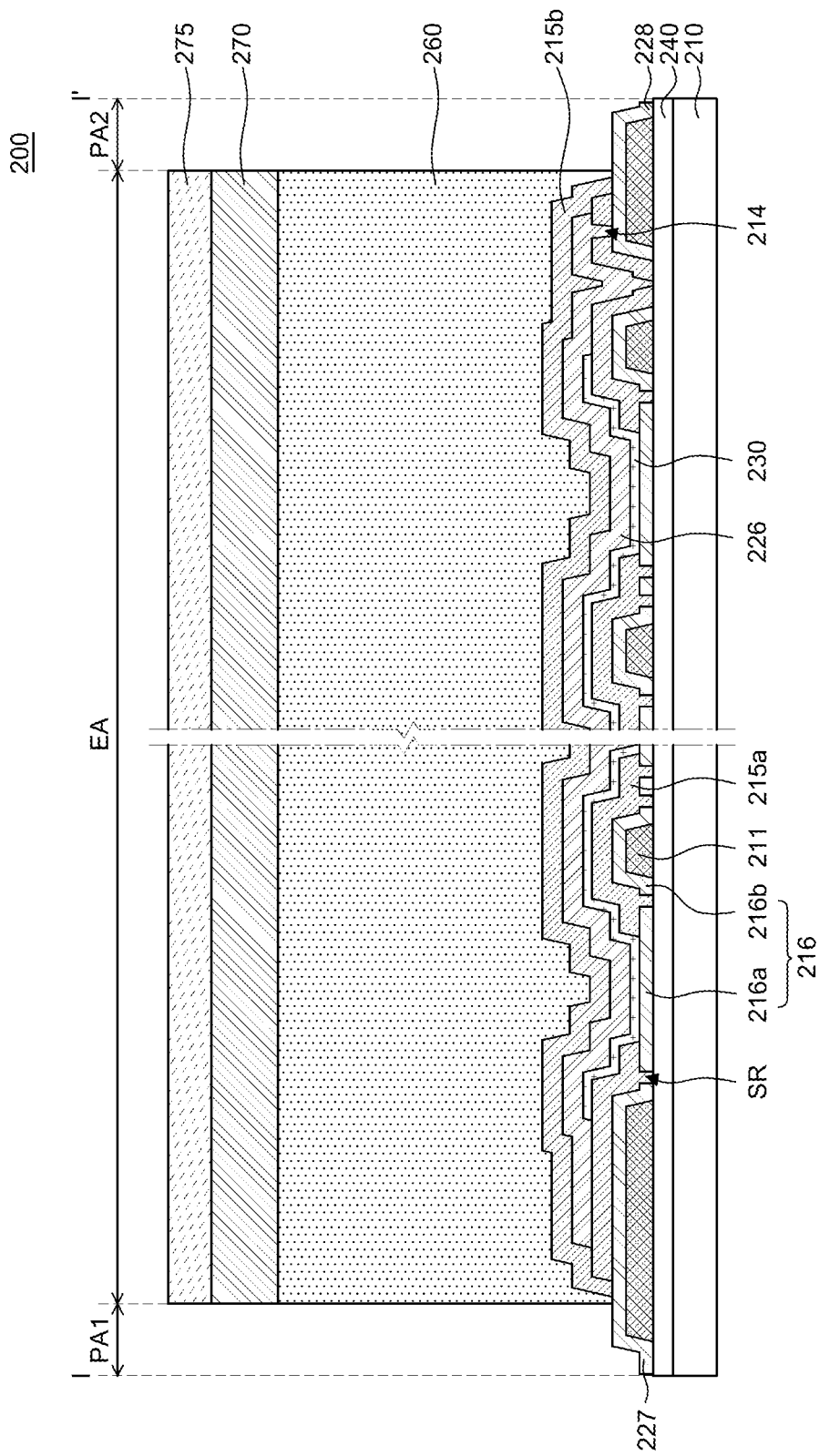
FIG. 8 is a cross-sectional view showing the lighting apparatus according to the second exemplary aspect, taken along line I-I' of FIG. 7.

FIG. 8 is a cross-sectional view showing the lighting apparatus according to the second exemplary aspect, taken along line I-I' of FIG. 7.

Figure 9:
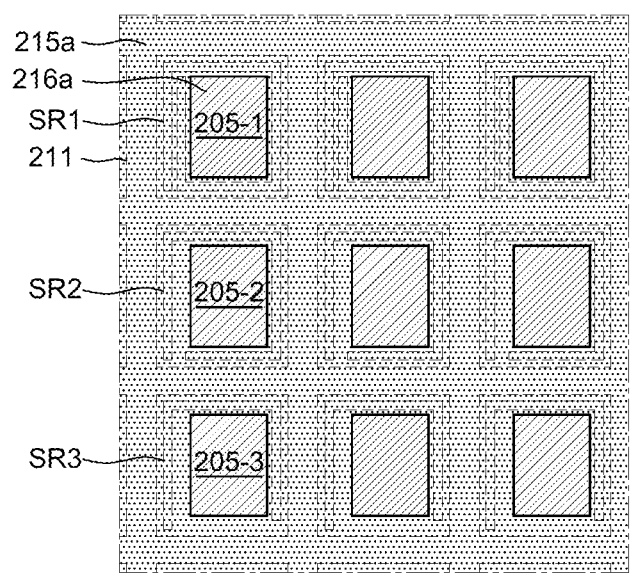
FIG. 9 is an enlarged view showing a part of an emission area in the lighting apparatus using organic light-emitting diodes according to the second exemplary aspect shown in FIG. 7.

FIG. 9 is an enlarged view showing a part of an emission area in the lighting apparatus using organic light-emitting diodes according to the second exemplary aspect shown in FIG. 7.

According to the exemplary aspect of the present disclosure, the lighting apparatus uses organic light-emitting diodes made of an organic material. In the lighting apparatus using organic light-emitting diodes, a TFT for driving may not be disposed in each of the pixels.

As described above, a flexible lighting apparatus is described as a lighting apparatus according to an exemplary aspect of the present disclosure as an example. It is, however, to be understood that the present disclosure can be equally applied to typical lighting apparatuses as well.

Like the first exemplary aspect described above, the lighting apparatus using organic light-emitting diodes according to the second exemplary aspect of the present disclosure may include an organic light-emitting diode unit where surface-emission occurs, and an encapsulation unit that encapsulates the organic light-emitting diode unit.

An outer light extraction layer may be further disposed under the organic light-emitting diode unit to increase the haze. It is, however, to be understood that the present disclosure is not limited thereto, and the outer light extraction layer may be eliminated.

The outer light extraction layer 145 may be formed by dispersing scattering particles such as TiO$_2$ in a resin and may be attached under the substrate by an adhesive layer.

Referring to FIGS. 7 to 9, the organic light-emitting diode unit may include an organic light-emitting diode disposed on a substrate 210, and an inner light extraction layer 240 may be further disposed between the substrate 210 and the organic light-emitting diode. It is, however, to be understood that the present disclosure is not limited thereto, and the inner light extraction layer may be eliminated.

A planarization layer (not shown) may be further disposed on the inner light extraction layer 240.

The lighting apparatus 200 according to the second exemplary aspect may include an emission area EA where light is actually emitted and output to the outside, and first and second pad areas PA1 and PA2 where first and second pad electrodes 227 and 228 are electrically connected to an external device, respectively, to apply signals to the emission area EA.

The first and second pad areas PA1 and PA2 are not covered by the sealing means of a metal film 270 and/or a protective film 275 and thus can be electrically connected to an external device through the pad electrodes 227 and 228, respectively. Therefore, the metal film 270 and/or the protective film 275 may be attached to the entire surface of the emission area EA of the substrate 210 except for the first and second pad areas PA1 and PA2. It is, however, to be understood that the present disclosure is not limited thereto.

That is to say, the organic layer 230 and the cathode 226 are not formed in the first and second pad areas PA1 and PA2 outside the emission area EA, and thus the first and second pad electrodes 227 and 228 may be exposed to the outside. A second passivation layer 215b of an organic material and a third passivation layer of an inorganic material (not shown) may be further formed in the emission area EA so as to cover the organic layer 230 and the cathode 226. It is, however, to be understood that the present disclosure is not limited thereto.

A part of the first passivation layer 215a on the second pad electrode 228 located in the emission area EA may be removed, such that a contact hole 214 for exposing the second pad electrode 228 may be formed. Accordingly, the cathode 226 may be electrically connected to the second pad electrode 228 through the contact hole 214.

The first and second pad areas PA1 and PA2 may be located outside the emission area EA. Although the second pad area PA2 is located between the first pad areas PA1 in the example shown in FIG. 7, the present disclosure is not limited thereto.

In addition, FIG. 7 shows an example where the first and second pad areas PA1 and PA2 are located only on one outer side of the emission area EA, but the present disclosure is not limited thereto. In other implementations, the first and second pad areas PA1 and PA2 may be located on both outer sides of the emission area EA. In addition, according to another exemplary aspect of the present disclosure, the first pad area PA1 may be located on one outer side of the emission area EA, and the second pad area PA2 may be located on the other side of the emission area EA.

The organic light-emitting diode unit will be described in more detail. An anode 216 and a cathode 226 are disposed on the substrate 210, and an organic layer 230 is disposed between the anode 216 and the cathode 226 to form an organic light-emitting diode.

In addition, the organic light-emitting diode unit may further include an auxiliary line 211 for supplementing the conductivity of the anode 216, and the first passivation layer 215a for preventing a short-circuit between the anode 216 and the cathode 226.

The substrate 210 may be made of transparent glass. In addition, the substrate 210 may be made of a polymer material having a flexibility such as polyimide (PI).

An inner light extraction layer 240 may be disposed on the substrate 210. It is, however, to be understood that the present disclosure is not limited thereto.

On the substrate 210, an anode 216 according to the second exemplary aspect may be disposed.

The anode 216 may be formed of indium tin oxide (ITO) or indium zinc oxide (IZO), which is a transparent metal oxide material having a high work function and high conductivity to facilitate injection of holes into the organic layer 230.

The anode 216 may include a first anode 216a in emission zones 205-1, 205-2 and 205-3, and a second anode 216b in a non-emission zone other than the emission zones 205-1, 205-2 and 205-3.

The second anode 216b may be disposed on the auxiliary line 211 to cover it. The first anode 216a may be formed in the emission zones 205-1, 205-2 and 205-3 defined by the auxiliary line 211 in a mesh shape.

In the lighting apparatus 200 according to the second exemplary aspect of the present disclosure, short-circuit reduction patterns SR1, SR2 and SR3 are formed on the first anode 216a to which electric current is supplied in the respective pixels to reflect a narrow path. The short-circuit reduction patterns SR1, SR2 and SR3 are covered with the first passivation layer 215a to prevent a short-circuit in the entire panel. That is to say, the short-circuit reduction patterns SR1, SR2 and SR3 surround the emission zones 205-1, 205-2 and 205-3 of the pixels, respectively. The electric current flowing to a short-circuit occurring area is limited by adding the resistance in each of the pixels in this manner.

Each of the short-circuit reduction patterns SR1, SR2 and SR3 may be formed by removing a predetermined part of the first anode 216a. The first passivation layer 215a may be disposed on the anode 216 including the short-circuit reduction patterns SR1, SR2 and SR3.

The short-circuit reduction patterns SR1, SR2 and SR3 may be in the shape of an open curve surrounding the border of the emission zones 205-1, 205-2 and 205-3, respectively. In addition, each of the short-circuit reduction patterns SR1, SR2 and SR3 may be a combination of straight lines or may include a curved line.

Each of the short-circuit reduction patterns SR1, SR2 and SR3 penetrates the first anode 216a vertically, and may be filled with the first passivation layer 215a.

On the other hand, the lighting apparatus 200 according to the second exemplary aspect is designed such that the resistances of the short-circuit reduction patterns SR1, SR2 and SR3 in the respective pixels have different values depending on the distance between the respective pixels and the first and second pad electrodes 227 and 228. Specifically, the short-circuit reduction patterns SR1, SR2 and SR3 may be designed to have a gradually-reducing resistances as the distance between the respective pixels and the first and second pad electrodes 227 and 228 increases.

In the example shown in FIG. 9, the short-circuit reduction patterns SR1, SR2 and SR3 are designed so that the open curve has a gradually-reducing length as the distance between the respective pixels and the first and second pad electrodes 227 and 228 increases, thereby compensating for the voltage drop (IR drop).

FIG. 9 shows a part of the emission area, e.g., the pixels arranged in a 3-by-3 matrix, and the same short-circuit reduction pattern SR1, SR2 or SR3 is applied in each row. It is, however, to be understood that the present disclosure is not limited thereto. The short-circuit reduction patterns SR1, SR2 and SR3 may have different resistances even in the same row.

In addition, FIG. 9 shows an example where the first and second pad areas PA1 and PA2 are located on the upper side, but the present disclosure is not limited thereto.

For example, a first short-circuit reduction pattern SR1 in the shape of an open curve having five straight lines may be formed outside the first emission zone 205-1 of the first row along the four sides of the first emission zone 205-1. A second short-circuit reduction pattern SR2 in the shape of an open curve having four straight lines may be formed outside the second emission zone 205-2 of the second row along the four sides of the second emission zone 205-2. In addition, a third short-circuit reduction pattern SR3 in the shape of an opening curve having three straight lines along three sides of the third emission zone 205-3 may be formed outside the third emission zone 205-3 in the third row. It is, however, to be understood that the present disclosure is not limited thereto. Any short-circuit reduction pattern may be employed as long as the open curve can be gradually reduced as the distance between the respective pixels and the first and second pad electrodes 227 and 228 increases.

As such, according to the second exemplary aspect of the present disclosure, the voltage drop that occurs as the distance from the first and second pad electrodes 227 and 228 increases can be compensated, so that the luminance uniformity of the lighting apparatus 200 can be improved. Accordingly, as the luminance uniformity can be improved, the lifetime can be elongated and the quality of the exterior can be improved.

Figure 10:
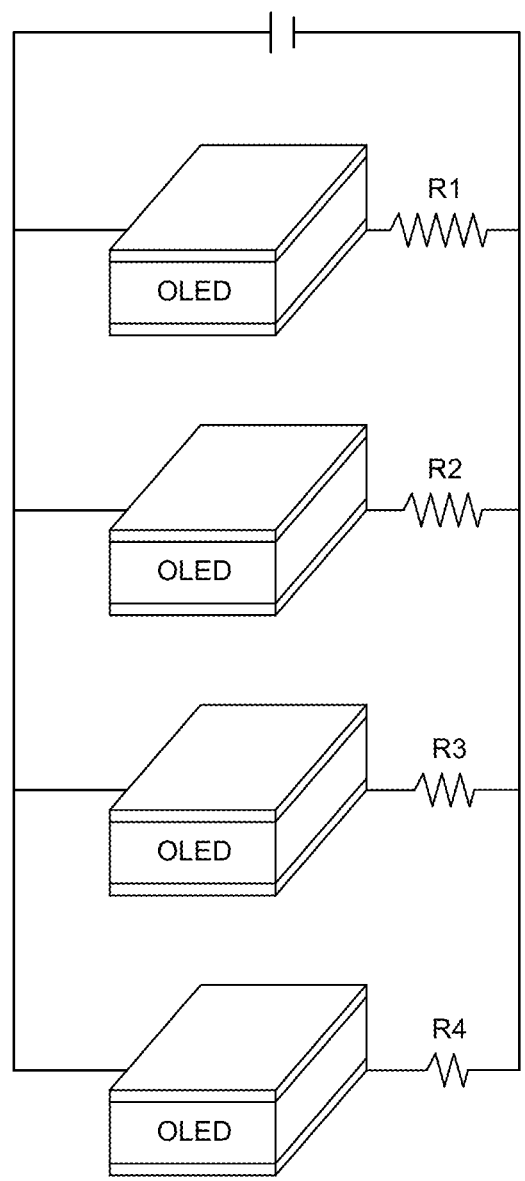
FIG. 10 is a schematic circuit diagram showing a lighting apparatus using organic light-emitting diodes according to the second exemplary aspect of the present disclosure.

FIG. 10 is a schematic circuit diagram showing a lighting apparatus using organic light-emitting diodes according to the second exemplary aspect of the present disclosure.

Figure 11:
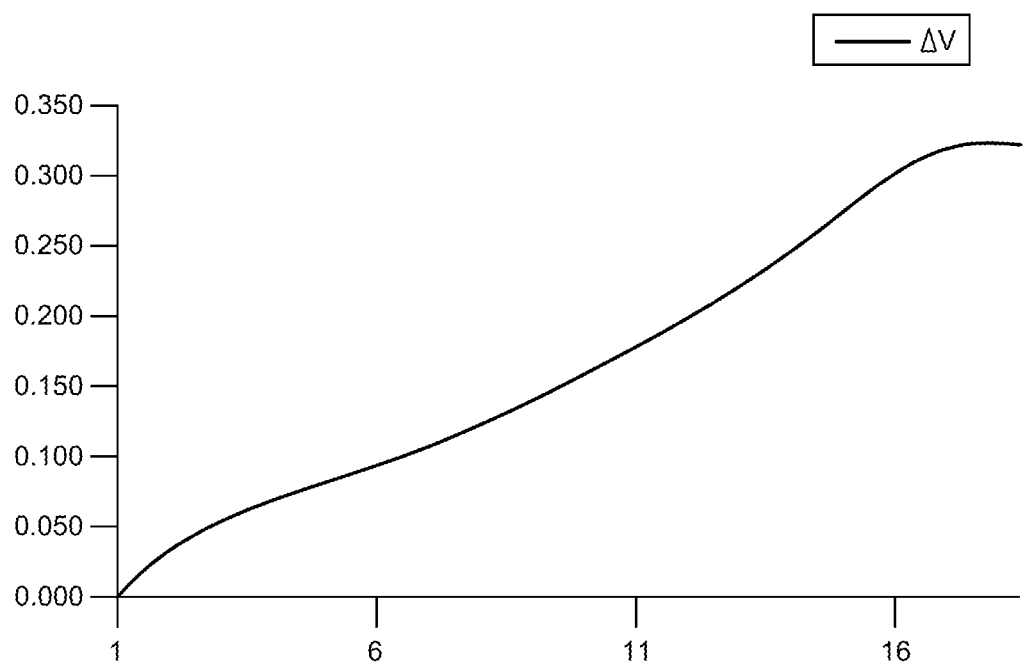
FIG. 11 is a graph showing a compensation voltage depending on location of pixel in the lighting apparatus using organic light-emitting diodes according to the second exemplary aspect of the present disclosure.

FIG. 11 is a graph showing a compensation voltage depending on locations of pixels in the lighting apparatus using organic light-emitting diodes according to the second exemplary aspect of the present disclosure. Specifically, FIG. 11 shows the compensating voltage for a row according to the distance from the end where electrical current is supplied.

Referring to FIG. 10, in the lighting apparatus using the organic light-emitting diodes according to the second exemplary aspect, a plurality of pixels is disposed in the panel, and each of the pixels includes an organic light-emitting diode OLED including an anode, an organic layer and a cathode.

It can be seen that the organic light-emitting diodes OLED are arranged in parallel with different distances from the end where electric current is supplied, for example, the pad electrode.

In each of the organic light-emitting diodes OLED, the short-circuit reduction pattern is formed to surround the border of the emission zone of each of the pixels. Resistor R1, R2, R3 and R4 are additionally connected in series to each of the pixels to limit a current flowing to a short-circuit occurring area.

It can be seen that the lighting apparatus according to the second exemplary aspect is designed such that the resistances R1, R2, R3 and R4 of the short-circuit reduction patterns for the respective pixels have different values as the distance from the end where electric current is supplied, e.g., the pad electrodes increases. Specifically, the resistances R1, R2, R3 and R4 of the short-circuit reduction patterns for the respective pixels may have reducing values as the distance from the pad electrodes increases.

In such case, it can be seen from FIG. 11 that the voltage drop due to the increase in distance from the pad electrodes is compensated for, and thus the luminance becomes uniform. As a result, the magnitude of the compensation voltage also decreases. For example, it can be seen that the compensation voltage of the nearest pixel with respect to the farthest pixel from the pad electrodes is 0.305 V, which is ignorable.

As such, the voltage drop that occurs as the distance from the first and second pad electrodes 227 and 228 increases can be compensated for, so that the luminance uniformity of the lighting apparatus 200 can be improved. Accordingly, as the luminance uniformity can be improved, the lifetime can be elongated and the quality of the exterior can be improved.

Referring back to FIGS. 7 to 9, the first pad electrode 227 made of the same conductive material as the anode 216 may be disposed on the same layer as the anode 216 in first pad area PA1 of the substrate 210, and the second pad electrode 228 may be disposed in the second pad area PA2.

The anode 216 is made of a transparent metal oxide material such as ITO and thus has the advantage of transmitting emitted light, but has the disadvantage of high electrical resistance as compared with opaque metal materials. Therefore, when the lighting apparatus 200 having a large area is fabricated, the current cannot be applied evenly across the emission zones 205-1, 205-2 and 205-3, such that the lighting apparatus 200 having the large area cannot emit light of uniform luminance.

Accordingly, according to the exemplary aspect of the present disclosure, the auxiliary line 211 made of an opaque metal material is further disposed on the substrate 210, and the anode 216 including the auxiliary line 211 may be disposed on the substrate 210.

The auxiliary line 211 is disposed on the entire emission area EA in a thin mesh shape, a hexagonal shape, an octagonal shape, a circular shape or the like, to allow a uniform electric current to flow in the first anode 216a of the emission zones 205-1, 205-2 and 205-3 in the entire emission area EA. As a result, the lighting apparatus 200 having a larger area can emit light of uniform luminance.

The auxiliary line 211 may be made of an opaque metal having good conductivity such as Al, Au, Cu, Ti, W and Mo, or an alloy thereof. Although not shown in the drawings, the auxiliary line 211 may have a two-layer structure of an upper auxiliary line and a lower auxiliary line. However, the present disclosure is not limited thereto. It may be made up of a single layer.

The first passivation layer 215a may be stacked in the emission area EA of the substrate 210.

For example, the first passivation layer 215a is shown as a rectangular frame having a generally uniform width in the example shown in FIG. 8. However, the first passivation layer 215a may be formed in a mesh shape so that it covers the auxiliary line 211 disposed in a mesh shape in the emission zones 205-1, 205-2 and 205-3. It is, however, to be understood that the present disclosure is not limited thereto.

The first passivation layer 215a may cover the auxiliary line 211 and the short-circuit reduction patterns SR1, SR2 and SR3 adjacent thereto. In addition, the passivation layer 215a may surround the auxiliary line 211 to reduce the level difference by the auxiliary line 211, so that various layers to be formed in subsequent processes can be reliably formed without being broken.

The first passivation layer 215a may be made of an inorganic material such as SiOx and SiNx.

However, the first passivation layer 215a may be made of an organic material such as photo acryl or may be made up of multiple layers of an inorganic material and an organic material.

The organic layer 230 and the cathode 226 may be disposed on the first passivation layer 215a disposed on the substrate 210. A part of the first passivation layer 215a on the second pad electrode 228 located in the emission area EA may be removed, such that a contact hole 214 for exposing the second pad electrode 228 may be formed. The cathode 226 may be electrically connected to the second pad electrode 228 thereunder through the contact hole 214.

The cathode 226 may be made of a conductive material having a low work function to facilitate injection of electrons into the organic layer 230. Examples of the material of the cathode 226 may include a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 230 may be made up of a single stack structure including a red organic emissive layer, a multi-stack tandem structure including a plurality of red organic emissive layers, or a multi-stack tandem structure including red/organic green light-emissive layers and a sky-blue organic emissive layer. It is, however, to be understood that the organic layer 230 of the present disclosure is not limited to the above-described structure, and various structures may be employed.

Figure 12A:
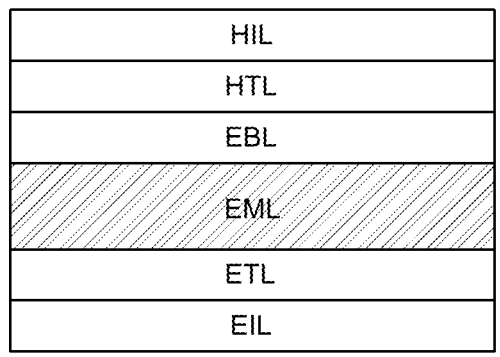
FIGS. 12A to 12C are cross-sectional views showing an example of a stack structure of an organic layer according to an exemplary aspect of the present disclosure.
Figure 12B:
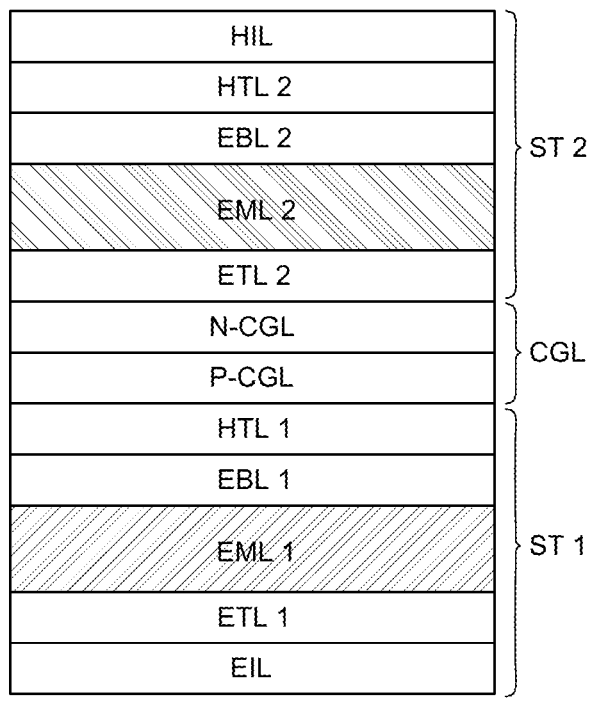
Figure 12C:
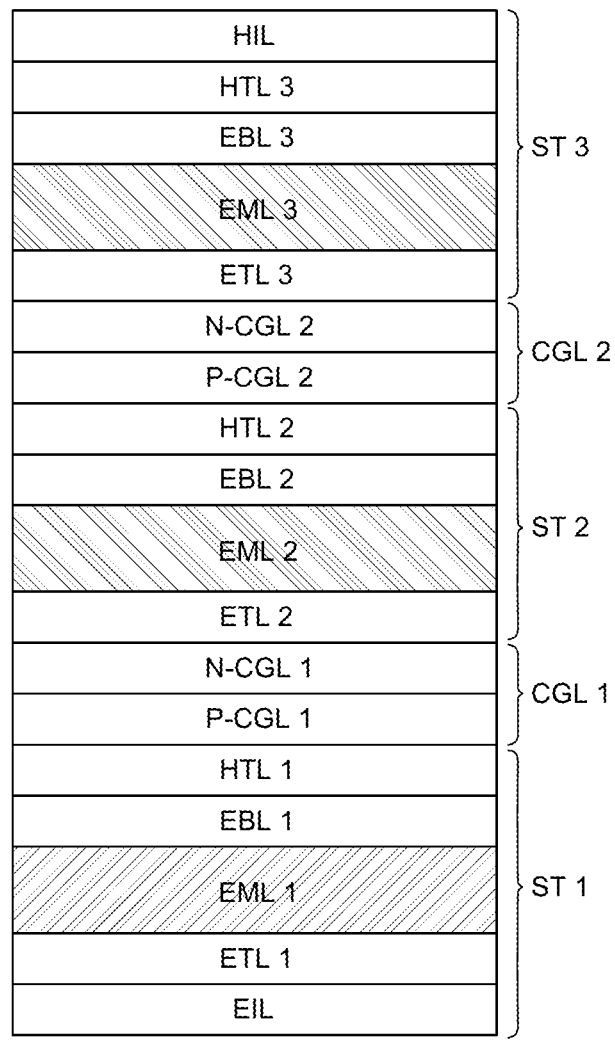

FIGS. 12A to 12C are cross-sectional views showing an example of a stack structure of an organic layer according to an exemplary aspect of the present disclosure.

Specifically, FIG. 12A shows an organic layer 230 of a single stack, FIG. 12B shows an organic layer 230 of a tandem structure including a double stack, and FIG. 12C shows an organic layer 230 of a tandem structure including a triple stack.

Referring to FIG. 12A, the organic layer 230 may include a hole injection layer HIL, a hole transport layer HTL, an electron blocking layer EBL, an organic emission layer EML, an electron transport layer ETL and an electron injection layer EIL sequentially stacked on one another.

The hole injection layer HIL is an organic layer that facilitates the injection of holes from the anode 216 into the organic emissive layer EML. The hole injection layer HIL may be made of, but is not limited to, a material including at least one selected from the group consisting of: HAT-CN (dipyrazino [2,3-f:2',3'-h]quinoxaline-2,3,6,7,10,11-hexacarbonitrile), CuPc(phthalocyanine), F4-TCNQ(2,3,5,6-tetrafluoro-7,7,8,8-tetracyano-quinodimethane), and NPD(N, N'-bis(naphthalene-1-yl)-N,N'-bis(phenyl)-2,2'-dimethylbenzidine.

The hole transport layer HTL is an organic layer that facilitates transfer of holes from the hole injection layer HIL into the organic emissive layer EML. The hole transport layer HTL may be made of, but is not limited to, a material including at least one selected from the group consisting of: NPD(N,N'-bis(naphthalene-1-yl)-N,N'-bis(phenyl)-2,2'-dimethylbenzidine), TPD(N,N'-bis-(3-methylphenyl)-N,N'-bis(phenyl)-benzidine), s-TAD(2,2',7,7'-tetrakis(N,N-dimethylamino)-9,9-spirofluorene) and MTDATA(4,4',4"-Tris (N-3-methylphenyl-N-phenyl-amino)-triphenylamine).

The electron blocking layer is an organic layer that suppresses electrons injected into the organic emissive layer EML from overflowing to the hole transport layer HTL. The electron blocking layer can improve the bonding of holes and electrons in the organic emissive layer EML by suppressing the movement of electrons and can improve the luminous efficiency of the organic emissive layer EML. The electron blocking layer EBL may be made of the same material as the hole transport layer HTL. Although the hole transport layer HTL and the electron blocking layer EBL may be formed as separate layers, the present disclosure is not limited thereto. The hole transport layer HTL and the electron blocking layer EBL may be formed as a single piece.

In the organic emissive layer EML, the holes supplied from the anode 216 and the electrons supplied from the cathode 226 are recombined to generate excitons. The region where the excitons are generated may be referred to as an emission zone or a recombination zone.

The organic emissive layer EML may be disposed between the hole transport layer HTL and the electron transport layer ETL and may include a material that can emit light of a particular color. The organic emissive layer EML may include a material that can emit red light.

The organic emissive layer EML may have a host-dopant system, in which a light-emitting dopant material is doped into a host material occupying a large weight ratio so that the light-emitting dopant material has a small weight ratio.

The organic emissive layer EML may include either a plurality of host materials or a single host material. The organic emissive layer EML comprising a plurality of host materials or a single host material may be doped with a red phosphorescent dopant material. That is to say, the organic emissive layer EML may be a red emissive layer, and the wavelength range of light emitted from the organic emissive layer EML may range approximately from 600 nm to 660 nm.

The red phosphorescent dopant material is a substance capable of emitting red light. The EL spectrum of the light emitted from the organic emissive layer EML doped with a red phosphorescent dopant material may have a peak in the range of red wavelength or near it.

The red phosphorescent dopant material may be made of, but is not limited to, a material including at least one of iridium (Ir) ligand complexes including Ir(ppy)3(fac tris(2-phenylpyridine)iridium), PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) Ir(piq)3(tris(1-phenylisoquinoline)iridium) and Ir(piq)2(acac)(bis(1-phenylisoquinoline)(acetylacetonate)iridium), PtOEP (octaethylporphyrinporphine platinum) PBD:Eu(DBM)3 (Phen) and perylene.

The electron transport layer ETL receives electrons from the electron injection layer EIL. The electron transport layer ETL transfers the supplied electrons to the organic emissive layer EML.

In addition, the electron transport layer ETL may work as a hole blocking layer HBL. The hole blocking layer can suppress the holes that have not participated in the recombination in the organic emissive layer EML from leaking.

The electron transport layer ETL may be made of, but is not limited to, at least one selected from the group consisting of: Liq(8-hydroxyquinolinato-lithium), PBD(2-(4-biphenyl)-5-(4-tert-butylphenyl)-1,3,4-oxadiazole), TAZ(3-(4-biphenyl)4-phenyl-5-tert-butylphenyl-1,2,4-triazole), BCP(2,9-Dimethyl-4,7-diphenyl-1,10-phenanthroline) and BAlq (bis(2-methyl-8-quinolinolate)-4-(phenylphenolato) aluminium).

The electron injection layer EIL is a layer that facilitates the injection of electrons from the cathode 226 to the organic emissive layer EML. The electron injection layer EIL may be made of, but is not limited to, a material including at least one of alkali metal or alkaline earth metal in the form of ions, such as LiF, $BaF_2$ and CsF.

The electron injection layer EIL and the electron transport layer ETL may be eliminated depending on the structure and characteristics of the lighting apparatus 200 using the organic light-emitting diodes.

Referring to FIG. 12B, the organic layer 230 may include a first stack ST1 including a first organic emissive layer EML1, a second stack ST2 including a second organic emissive layer EML2, and a charge generation layer CGL disposed between the first stack ST1 and the second stack ST2.

The first stack ST1 may include an electron injection layer EIL, a first electron transport layer ETL1, a first organic emissive layer EML1, a first electron blocking layer EBL1, and a first hole transport layer HTL1. The second stack ST2 may include a second electron transport layer ETL2, a second organic emissive layer EML2, a second electron blocking layer EBL2, a second hole transport layer HTL2 and a hole injection layer HIL. The functions and configurations of the layers have been described above.

The charge generation layer CGL may be disposed between the first stack ST1 and the second stack ST2. The charge generation layer CGL may supply charges to the first stack ST1 and the second stack ST2 to balance the charges between the first stack ST1 and the second stack ST2.

The charge generation layer CGL may include an n-type charge generation layer N-CGL and a p-type charge generation layer P-CGL. The n-type charge generation layer N-CGL may be in contact with the second electron transport layer ETL2. The p-type charge generation layer P-CGL may be disposed between the n-type charge generation layer N-CGL and the first hole transport layer HTL1. Although the charge generation layer CGL may be made up of multiple layers including the n-type charge generation layer N-CGL and the p-type charge generation layer P-CGL, the present disclosure is not limited thereto. The charge generation layer CGL may be made up of a single layer.

The n-type charge generation layer N-CGL may inject electrons into the first stack ST1. The n-type charge generation layer N-CGL may include an n-type dopant material and an n-type host material. The n-type dopant material may be metals in Groups I and II in the Periodic Table, an organic material to which electrons can be injected, or a mixture thereof. For example, the n-type dopant material may be alkali metal or alkali earth metal. That is to say, the n-type charge generation layer N-CGL may be made of, but is not limited to, an alkali metal such as lithium (Li), sodium (Na), potassium (K) and cesium (Cs), or an alkali earth metal such as magnesium (Mg), strontium (Sr), barium (Ba) and radium (Ra). For example, the n-type host material may be made of a material capable of delivering electrons including, but is not limited to, at least one of Alq3(tris(8-hydroxyquinolino) aluminum), Liq(8-hydroxyquinolinato-lithium), PBD(2-(4-biphenylyl)-5-(4-tert-butylphenyl)-1,3,4oxadiazole), TAZ(3-(4-biphenyl)4-phenyl-5-tert-butylphenyl-1,2,4-triazole), spiro-PBD, and BAlq(bis(2-methyl-8-quinolinolate)-4-(phenylphenolato)aluminium), SAlq, TPBi(2.2',2-(1,3,5-benzinetriyl)-tris(1-phenyl-1-H-benzimidazole),
oxadiazole, triazole, phenanthroline, benzoxazole or benzthiazole.

The p-type charge generation layer P-CGL may inject holes into the second stack ST2. The p-type charge generation layer P-CGL may include a p-type dopant material and a p-type host material. The p-type dopant material may be made of, but is not limited to, a metal oxide, an organic material such as tetra(fluoro)-tetra(cyano) quinodimethane (F4-TCNQ), HAT-CN (Hexaazatriphenylene-hexacarbonitrile) and hexaazatriphenylene, or a metal material such as V2O5, MoOx and $WO_3$. The p-type host material may be made of a material capable of delivering holes including, but is not limited to, at least one of NPD(N,N-dinaphthyl-N,N'-diphenyl benzidine)(N,N'-bis(naphthalene-1-yl)-N,N'-bis(phenyl)-2,2'-dimethylbenzidine), TPD(N,N'-bis-(3-methylphenyl)-N,N'-bis-(phenyl)-benzidine) and MTDATA(4,4', 4-Tris(N-3-methylphenyl-N-phenyl-amino)-triphenylamine).

Referring to FIG. 12C, the organic layer 230 may include a first stack ST1 including a first organic emissive layer EML1, a second stack ST2 including a second organic emissive layer EML2, a third stack ST3 including a third organic emissive layer EML3, a first charge generation layer CGL1 disposed between the first stack ST1 and the second stack ST2, and a second charge generation layer CGL2 disposed between the second stack ST2 and the third stack ST3.

The first stack ST1 may include an electron injection layer EIL, a first electron transport layer ETL1, a first organic emissive layer EML1, a first electron blocking layer EBL1, and a first hole transport layer HTL1. The second stack ST2 may include a second electron transport layer ETL2, a second organic emissive layer EML2, a second electron blocking layer EBL2 and a second hole transport layer HTL2. The third stack ST3 may include a third electron transport layer ETL3, a third organic emissive layer EML3, a third electron blocking layer EBL3, a third hole transport layer HTL3 and a hole injection layer HIL. The functions and configurations of the layers have been described above.

The first charge generation layer CGL1 may include a first n-type charge generation layer N-CGL1 and a first p-type charge generation layer P-CGL1. The first n-type charge generation layer N-CGL1 may be in contact with the second electron transport layer ETL2. The first p-type charge generation layer P-CGL1 may be disposed between the first n-type charge generation layer N-CGL1 and the first hole transport layer HTL1.

The second charge generation layer CGL2 may include a second n-type charge generation layer N-CGL2 and a second p-type charge generation layer P-CGL2. The second n-type charge generation layer N-CGL2 may be in contact with the third electron transport layer ETL3. The second p-type charge generation layer P-CGL2 may be disposed between the second n-type charge generation layer N-CGL2 and the second hole transport layer HTL2. The functions and configurations of the first and second charge generation layers CGL1 and CGL2 are identical to those described above.

The first organic emissive layer EML1 and the third organic emissive layer EML3 may be red-green organic emissive layers, and the wavelength range of the light emitted from the first organic emissive layer EML1 and the third organic emissive layer EML3 may range from approximately 520 nm to 580 nm. In addition, the second organic emissive layer EML2 is a sky blue emissive layer, and the wavelength range of the light emitted from the second organic emissive layer EML2 may range from approximately 450 nm to 480 nm.

As described above, when electric current is applied between the anode 216 and the cathode 226, electrons are injected into the organic layer 230 from the cathode 226 while holes are injected from the anode 216 into the organic layer 230. Thereafter, excitons are generated in the organic layer 230. As the excitons decay, light is generated, which is equal to the energy difference between the lowest unoccupied molecular orbital (LUMO) and the highest occupied molecular orbital (HOMO).

The light generated in the organic layer 230 may travel upward (top-emission) or downward (bottom-emission) depending on the transmittance and reflectance of the conductive layer, the anode 216 and the cathode 226.

For example, when conductive layer 213 and the anode 216 are transparent electrodes while the cathode 226 is a reflective electrode, the light generated in the organic layer 230 is reflected by the cathode 226 to be transmitted through the conductive layer and the anode 216, such that the light exits through the bottom of the organic light-emitting diode unit 101. That is to say, the organic light-emitting diode unit is of the bottom-emission type. It is, however, to be understood that the present disclosure is not limited thereto. When the conductive layer and anode 216 are reflective electrodes while the cathode 226 is a transparent electrode, the organic light-emitting diode unit 101 may be of the top-emission type.

Referring back to FIGS. 7 to 9, since the first passivation layer 215a is disposed on the auxiliary lines 211 in the emission area EA, the organic layer 230 above the auxiliary lines 211 is not in contact with the auxiliary lines 211, such that no organic light-emitting diode is formed above the auxiliary lines 211. In other words, in the emission area EA, the organic light-emitting diode is formed only in the emission zones 205-1, 205-2 and 205-3 in a generally rectangular shape between the auxiliary lines 211 in a mesh shape, for example.

A second passivation layer 215b and a third passivation layer may be disposed on the substrate 210 on which the cathode 226 is formed.

The second passivation layer 215b is formed to cover the organic layer 230 and the cathode 226 in the emission area EA and may prevent moisture from permeating into the organic layer 230 in the emission area EA.

According to the exemplary aspect of the present disclosure, the second passivation layer 215b and the third passivation layer are formed so as to cover the organic layer 230 and the cathode 226 in the emission area EA in addition to the adhesive layer 260 and the sealing means of the metal film 270, so that it is possible to prevent moisture from permeating into the organic layer 230 of the lighting apparatus 200 in which light is actually emitted and output.

The second passivation layer 215b may be made of an organic material such as photo acryl. The third passivation layer may be made of an inorganic material such as SiOx and SiNx. It is, however, to be understood that the present disclosure is not limited thereto.

An encapsulant may be disposed on the third passivation layer. Such an encapsulant may include an epoxy compound, an acrylate compound, an acrylic compound, or the like.

As described above, on the substrate 210 in the first pad area PA1, the first pad electrode 227 connected to the anode 216 may be exposed to the outside. In the second pad area PA2 of the substrate 210, the second pad electrode 228 electrically connected to the cathode 226 through the contact hole 214 may be exposed to the outside. Accordingly, the first pad electrode 227 and the second pad electrode 228 are electrically connected to an external power source to apply current to the anode 216 and the cathode 226, respectively.

The adhesive layer 260 such as a pressure-sensitive adhesive (PSA) may be disposed on the third passivation layer, and the metal film 270 may be disposed on the adhesive layer 260 so that the metal film 270 is attached to the third passivation layer. As a result, the lighting apparatus 200 can be sealed.

The adhesive layer 260 may be formed of a photo-curable adhesive or a thermosetting adhesive.

For example, the adhesive layer 260 may be implemented as a pressure sensitive adhesive (PSA) for attaching the metal film 270 to the organic light-emitting diode unit. The thickness of the adhesive layer 260 may be approximately 30 μm. It is, however, to be understood that the present disclosure is not limited thereto, and the thickness may vary depending on the design choice of the lighting apparatus 200.

The metal film 270 is disposed on the adhesive layer 260 and serves to maintain the rigidity of the lighting apparatus 200. To this end, the metal film 270 may be made of copper having a thickness of approximately 20 μm. It is, however, to be understood that the present disclosure is not limited thereto. The metal film 270 may be modified depending on the design choice of the lighting apparatus 200.

The adhesive layer 260 and the sealing means of the metal film 270 can be attached so that the second passivation layer 215*b* and the third passivation layer are covered sufficiently.

In addition, the metal film 270 may be attached to the entire surface of the emission area EA of the substrate 210 except for the pad areas PA1 and PA2.

That is to say, the protective film 275 may be disposed on the metal film 270 to absorb external impact to protect the lighting apparatus 200. To this end, the protective film 275 may be implemented as a polyethylene terephthalate (PET) having a thickness of approximately 100 μm, which is a polymer film. It is, however, to be understood that the present disclosure is not limited thereto, but the protective film 275 may be modified depending on the design choice of the lighting apparatus 200.

Figure 13:
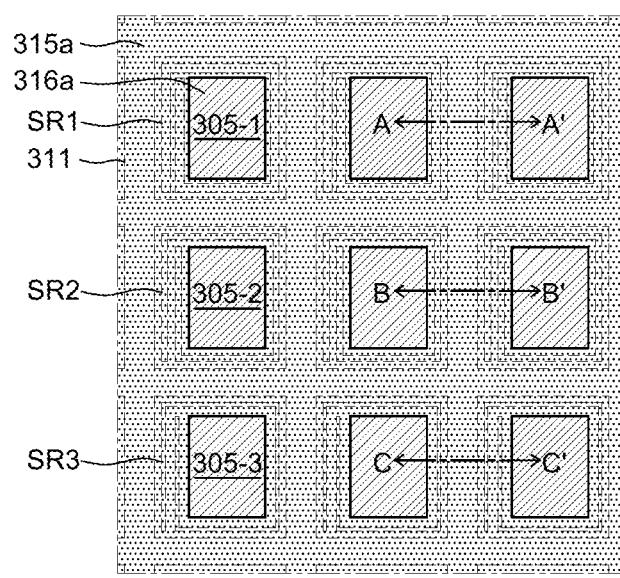
FIG. 13 is a plan view showing a part of an emission area in the lighting apparatus using organic light-emitting diodes according to a third exemplary aspect of the present disclosure.

FIG. 13 is a plan view showing a part of an emission area in the lighting apparatus using organic light-emitting diodes according to the third exemplary aspect of the present disclosure.

A lighting apparatus according to the third exemplary aspect of the present disclosure shown in FIG. 13 is substantially identical to the lighting apparatus according to the second exemplary aspect described above except that the width of the short-circuit reduction pattern is reduced as the distance from the pad electrodes increases; and, therefore, the redundant description will be omitted.

Figure 14A:
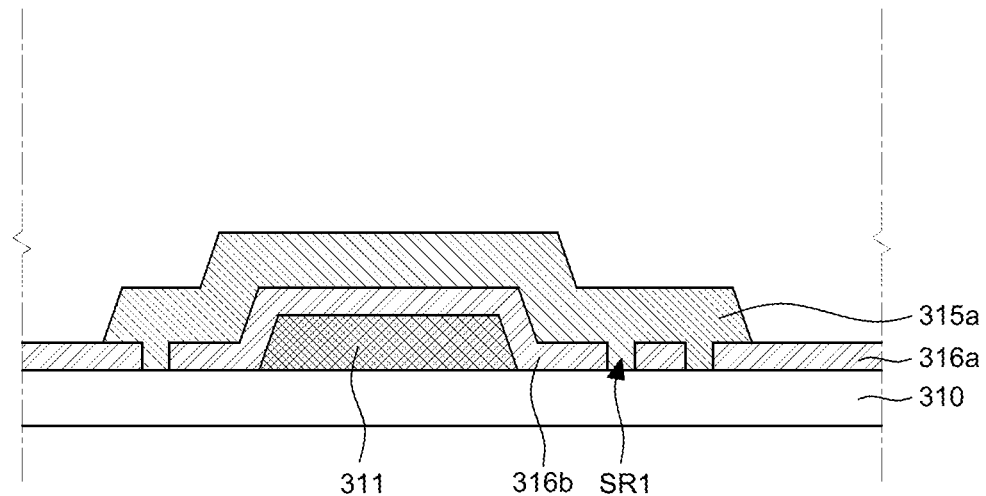
FIG. 14A is a cross-sectional view showing a part of the emission area, taken along line A-A' of FIG. 13.
Figure 14B:
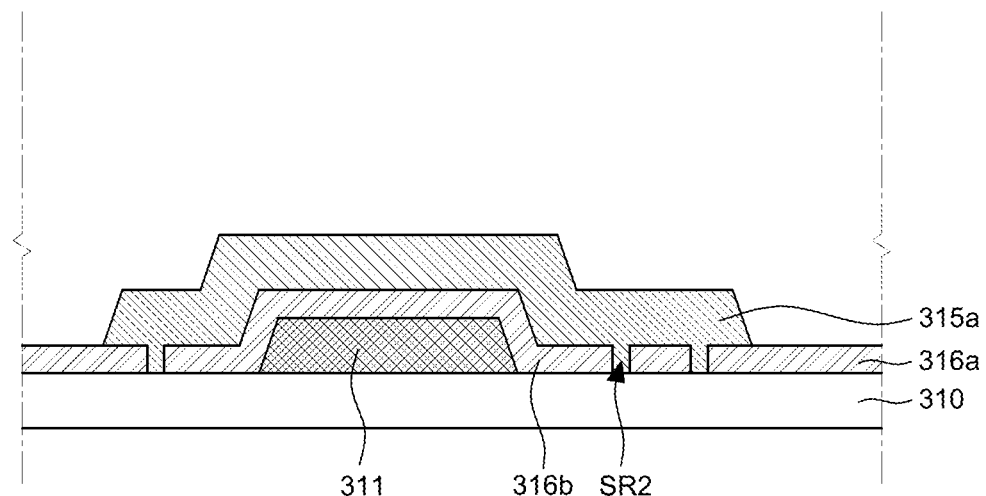
FIG. 14B is a cross-sectional view showing a part of the emission area, taken along line B-B' of FIG. 13.
Figure 14C:
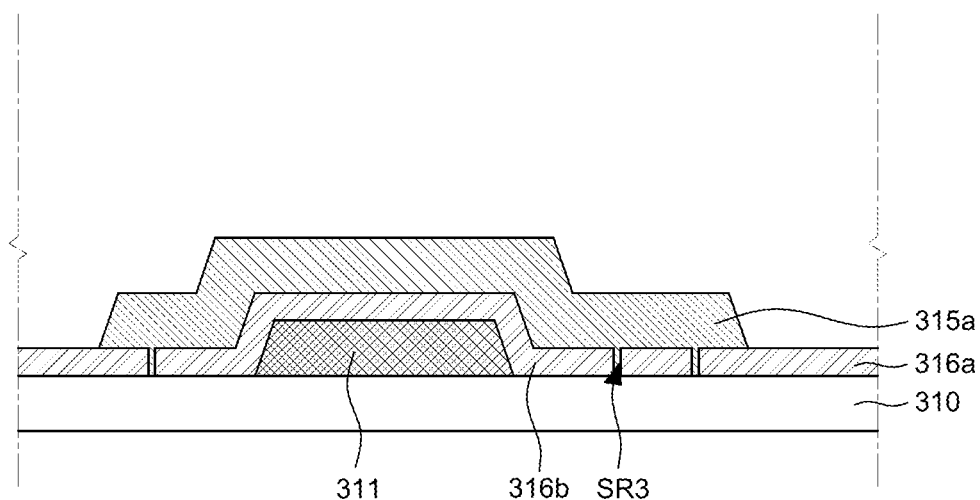
FIG. 14C is a cross-sectional view showing a part of the emission area, taken along line C-C' of FIG. 13.

FIG. 14A is a cross-sectional view showing a part of the emission area, taken along line A-A' of FIG. 13. FIG. 14B is a cross-sectional view showing a part of the emission area, taken along line B-B' of FIG. 13. FIG. 14C is a cross-sectional view showing a part of the emission area, taken along line C-C' of FIG. 13.

Referring to FIGS. 13 and 14A to 14C, anodes 316*a* and 316*b* may be disposed on a substrate 310 according to the third exemplary aspect of the present disclosure.

The anodes 316*a* and 316*b* may be formed of indium tin oxide (ITO) or indium zinc oxide (IZO), which is a transparent metal oxide material having a high work function and high conductivity to facilitate injection of holes into the organic layer.

The anodes 316*a* and 316*b* may include a first anode 316*a* in the emission zones 305-1, 305-2 and 305-3, and a second anode 316*b* in the non-emission zone other than the emission zones 305-1, 305-2 and 305-3.

The second anode 316*b* may be disposed on an auxiliary line 311 to cover it. The first anode 316*a* may be formed in the emission zones 305-1, 305-2 and 305-3 defined by the auxiliary line 311 in a mesh shape.

In the lighting apparatus according to the third exemplary aspect of the present disclosure, like the second exemplary aspect of the present disclosure described above, each of short-circuit reduction patterns SR1, SR2 and SR3 is formed on the first anode 316*a* to which electric current is supplied in each pixel to reflect a narrow path. The short-circuit reduction patterns SR1, SR2 and SR3 are covered with the first passivation layer 315*a* to prevent a short-circuit in the entire panel. That is to say, the short-circuit reduction patterns SR1, SR2 and SR3 surround the emission zones 305-1, 305-2 and 305-3 of the pixels, respectively. The electric current flowing to a short-circuit occurring area is limited by adding the resistance in each of the pixels.

Each of the short-circuit reduction patterns SR1, SR2 and SR3 may be formed by removing a predetermined part of the first anode 316*a*. The first passivation layer 315*a* may be disposed on the anodes 316*a* and 316*b* including the short-circuit reduction patterns SR1, SR2 and SR3.

The short-circuit reduction patterns SR1, SR2 and SR3 may be in the shape of an open curve surrounding the border of the emission zones 305-1, 305-2 and 305-3, respectively. In addition, each of the short-circuit reduction patterns SR1, SR2 and SR3 may be a combination of straight lines or may include a curved line.

Each of the short-circuit reduction patterns SR1, SR2 and SR3 penetrates the first anode 316*a* vertically, and may be filled with the first passivation layer 315*a*.

On the other hand, the lighting apparatus according to the third exemplary aspect is designed such that the resistances of the short-circuit reduction patterns SR1, SR2 and SR3 in the respective pixels have different values depending on the distance between the respective pixels and the first and second pad electrodes. Specifically, the short-circuit reduction patterns SR1, SR2 and SR3 may be designed to have gradually-reducing resistances as the distance between the respective pixels and the first and second pad electrodes increases.

In the example shown in FIGS. 13 and 14A to 14C, the short-circuit reduction patterns SR1, SR2 and SR3 are designed so that the open curve has a gradually-reducing width as the distance between the respective pixels and the first and second pad electrodes 227 and 228 increases, thereby compensating for the voltage drop (IR drop).

In the example shown in FIG. 13, the pixels are arranged in a 3-by-3 matrix, and the same short-circuit reduction pattern SR1, SR2 or SR3 is applied in each row. It is, however, to be understood that the present disclosure is not limited thereto. The short-circuit reduction patterns SR1, SR2 and SR3 may have different resistances even in the same row.

In addition, FIG. 13 shows an example where the first and second pad areas are located on the upper side, but the present disclosure is not limited thereto.

For example, a first short-circuit reduction pattern SR1 in the shape of an open curve having five straight lines and a first width may be formed outside the first emission zone 305-1 of the first row along the four sides of the first emission zone 305-1. A second short-circuit reduction pattern SR2 in the shape of an open curve having five straight lines and a second width may be formed outside the second emission zone 305-2 of the second row along the four sides of the second emission zone 305-2. The second width may be smaller than the first width.

In addition, a third short-circuit reduction pattern SR3 in the shape of an opening curve having five straight lines and a third width along four sides of the third emission zone 305-3 may be formed outside the third emission zone 305-3 in the third row. The third width may be smaller than the first width and the second width.

It is, however, to be understood that the present disclosure is not limited thereto. Any short-circuit reduction pattern may be employed as long as the open curve has a gradually reducing width as the distance between the respective pixels and the first and second pad electrodes 227 and 228 increases. The shape of the short-circuit reduction patterns SR1, SR2, SR3 is not limited to those described above.

According to some exemplary aspects of the present disclosure, the short-circuit reduction pattern may be filled with an insulating material other than the first passivation layer. For example, the short-circuit reduction patterns may be filled with different insulating materials with gradually reducing resistance as the distance between the respective pixels and the first and second pad electrode increases. This will be described with respect to a fourth exemplary aspect of the present disclosure.

Figure 15:
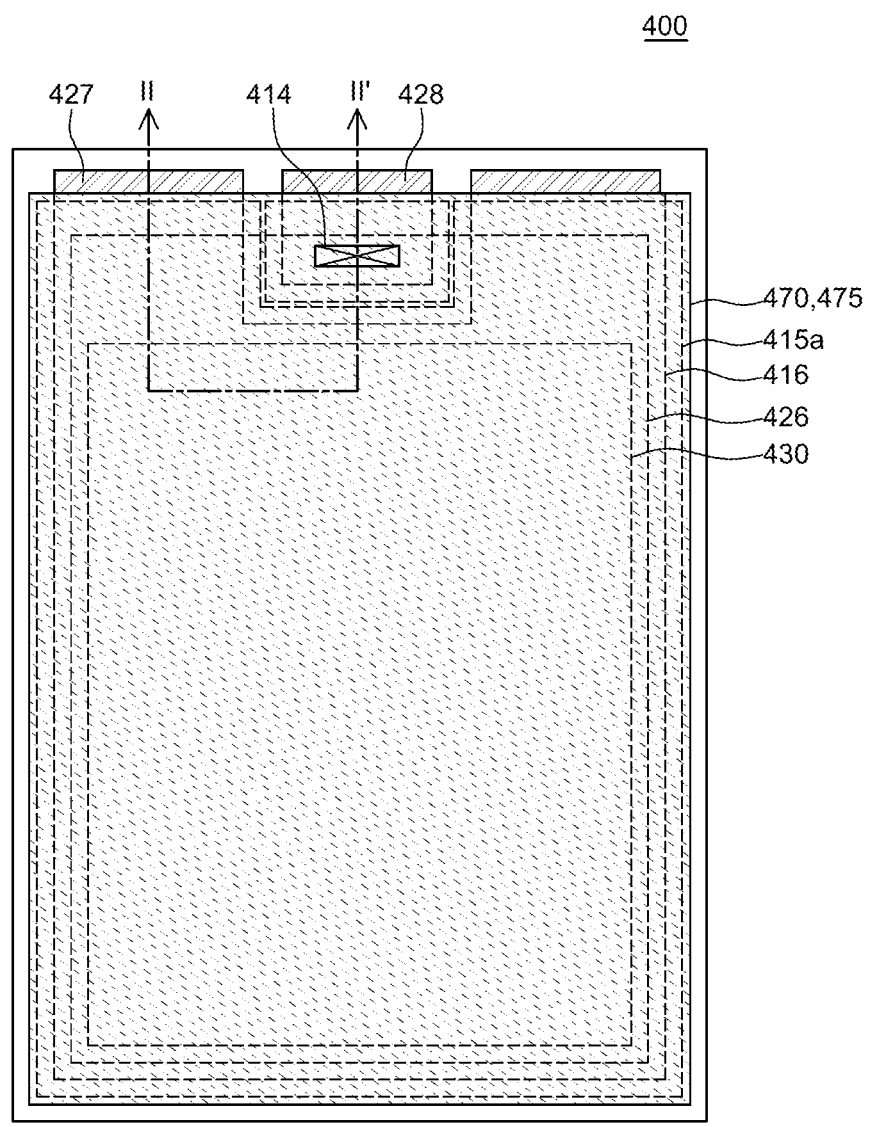
FIG. 15 is a plan view showing an example of the lighting apparatus using organic light-emitting diodes according to a fourth exemplary aspect of the present disclosure.

FIG. 15 is a plan view showing an example of the lighting apparatus using organic light-emitting diodes according to the fourth exemplary aspect of the present disclosure.

Figure 16:
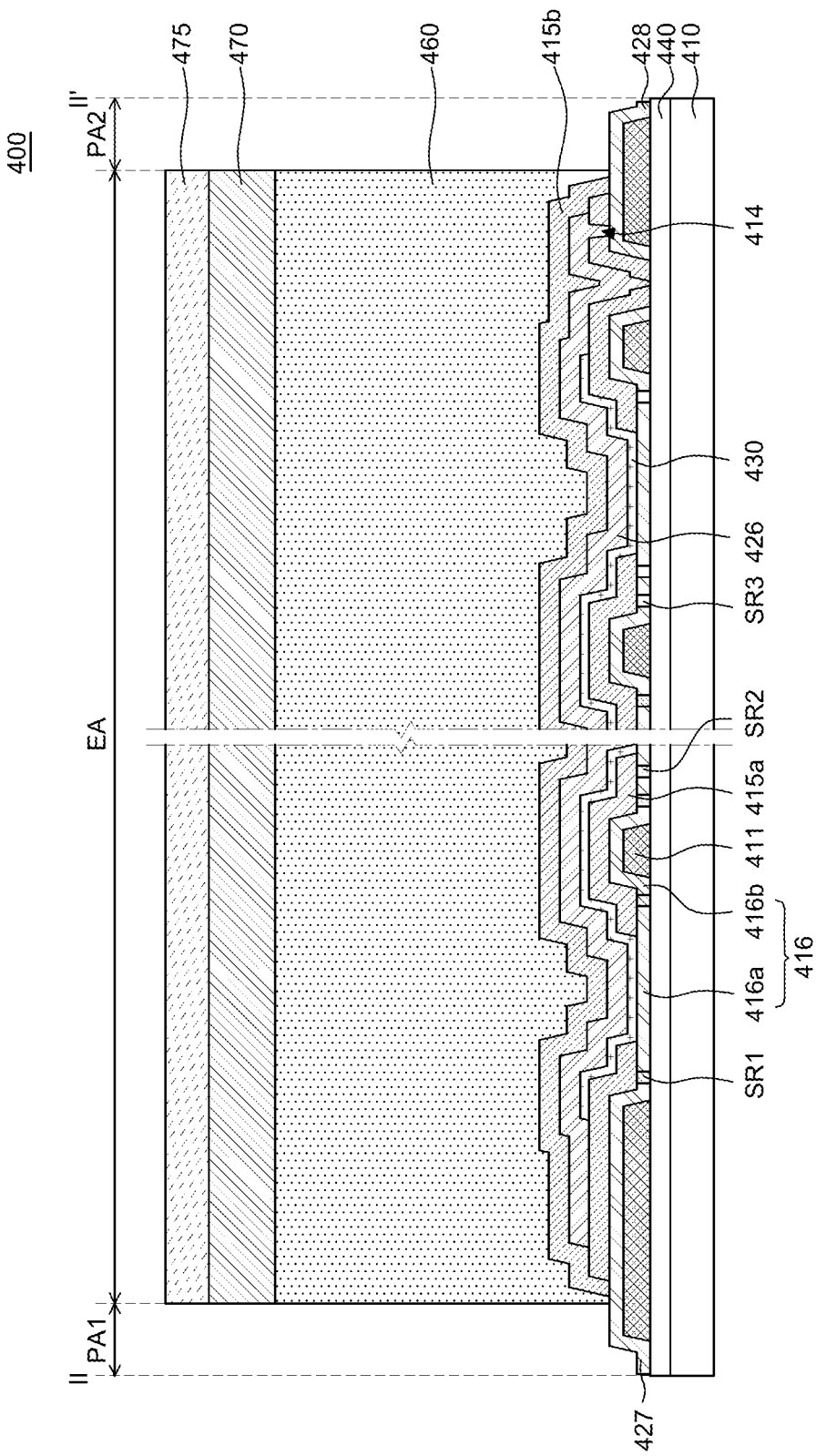
FIG. 16 is a cross-sectional view showing the lighting apparatus using organic light-emitting diodes according to the fourth exemplary aspect, taken along line II-II' of FIG. 15.

FIG. 16 is a cross-sectional view showing the lighting apparatus using organic light-emitting diodes according to the fourth exemplary aspect, taken along line II-II' of FIG. 15.

Figure 17:
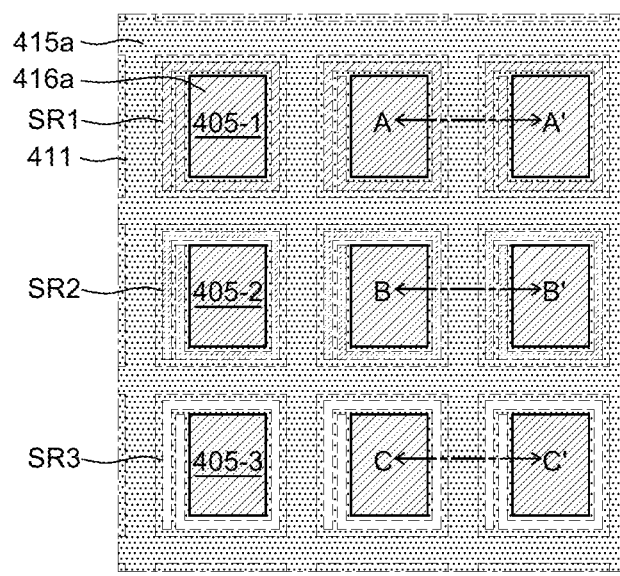
FIG. 17 is an enlarged view showing a part of an emission area in the lighting apparatus using organic light-emitting diodes according to the fourth exemplary aspect shown in FIG. 15.
Figure 18A:
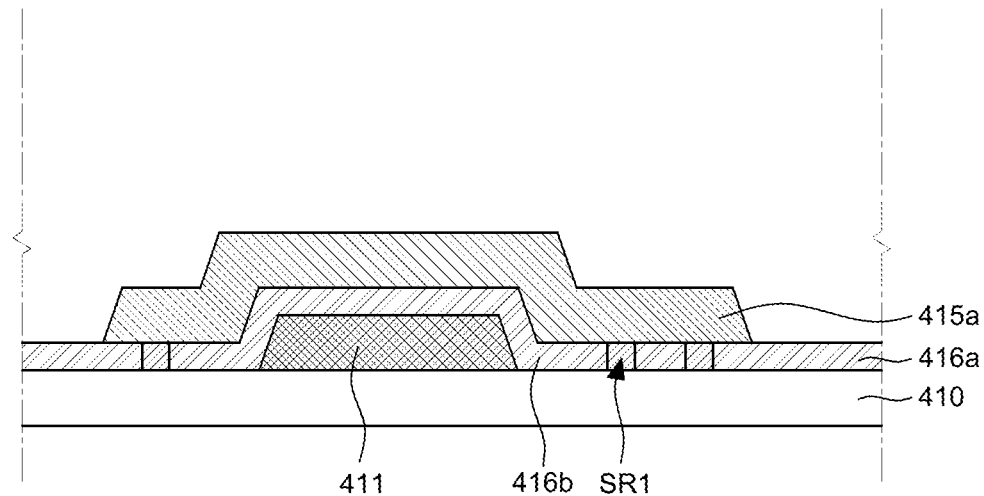
FIG. 18A is a cross-sectional view showing a part of the emission area, taken along line A-A' of FIG. 17.
Figure 18B:
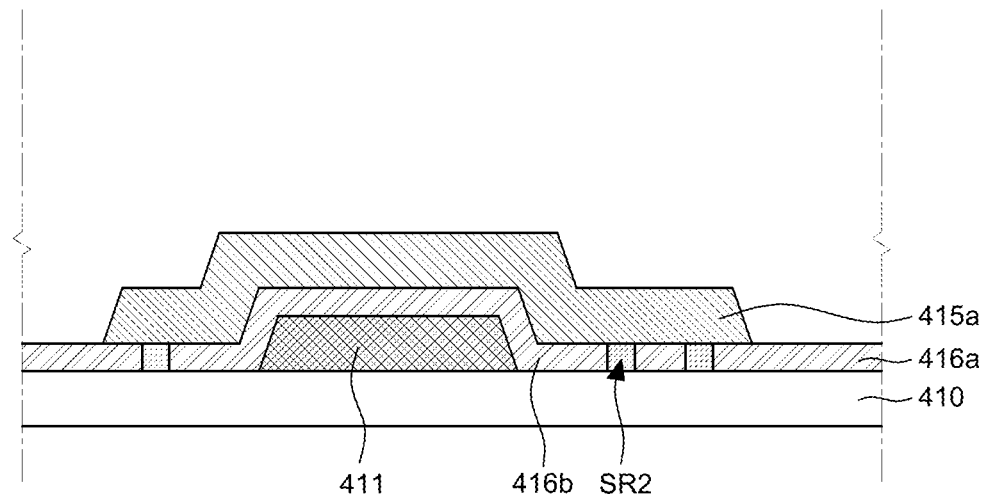
FIG. 18B is a cross-sectional view showing a part of the emission area, taken along line B-B' of FIG. 17.
Figure 18C:
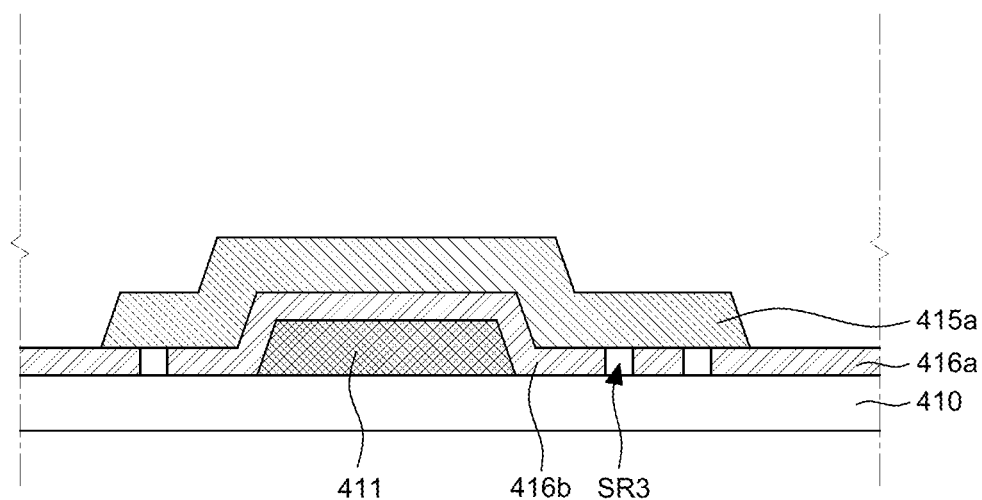
FIG. 18C is a cross-sectional view showing a part of the emission area, taken along line C-C' of FIG. 17.

FIG. 17 is an enlarged view showing a part of an emission area in the lighting apparatus using organic light-emitting diodes according to the fourth exemplary aspect shown in FIG. 15. FIG. 18A is a cross-sectional view showing a part of the emission area, taken along line A-A' of FIG. 17. FIG. 18B is a cross-sectional view showing a part of the emission area, taken along line B-B' of FIG. 17. FIG. 18C is a cross-sectional view showing a part of the emission area, taken along line C-C' of FIG. 17.

According to the exemplary aspect of the present disclosure, the lighting apparatus uses organic light-emitting diodes made of an organic material. In the lighting apparatus using organic light-emitting diodes, a TFT for driving may not be disposed in each of the pixels.

As described above, a flexible lighting apparatus is described as a lighting apparatus according to an exemplary aspect of the present disclosure as an example. It is, however, to be understood that the present disclosure can be equally applied to typical lighting apparatuses as well.

Like the first to third exemplary aspects described above, the lighting apparatus using organic light-emitting diodes according to the fourth exemplary aspect of the present disclosure may include an organic light-emitting diode unit and an encapsulation unit that encapsulates the organic light-emitting diode unit.

An outer light extraction layer may be further disposed under the organic light-emitting diode unit to increase the haze. It is, however, to be understood that the present disclosure is not limited thereto, and the outer light extraction layer may be eliminated.

The outer light extraction layer 145 may be formed by dispersing scattering particles such as $TiO_2$ in a resin and may be attached under the substrate by an adhesive layer.

Referring to FIGS. 15 to 18A to 18C, the organic light-emitting diode unit may include an organic light-emitting diode disposed on a substrate 410, and an inner light extraction layer 440 may be further disposed between the substrate 410 and the organic light-emitting diode. It is, however, to be understood that the present disclosure is not limited thereto, and the inner light extraction layer may be eliminated.

A planarization layer (not shown) may be further disposed on the inner light extraction layer 440.

The lighting apparatus 400 according to the fourth exemplary aspect may include an emission area EA where light is actually emitted and output to the outside, and first and second pad areas PA1 and PA2 where first and second pad electrodes 427 and 428 are electrically connected to an external device, respectively, to apply signals to the emission area EA.

The first and second pad areas PA1 and PA2 are not covered by the sealing means of a metal film 470 and/or a protective film 475 and thus can be electrically connected to an external device through the pad electrodes 427 and 428, respectively. Therefore, the metal film 470 and/or the protective film 475 may be attached to the entire surface of the emission area EA of the substrate 410 except for the first and second pad areas PA1 and PA2. It is, however, to be understood that the present disclosure is not limited thereto.

That is to say, the organic layer 430 and the cathode 426 are not formed in the first and second pad areas PA1 and PA2 outside the emission area EA, and thus the first and second pad electrodes 427 and 428 may be exposed to the outside. A second passivation layer 415b of an organic material and a third passivation layer of an inorganic material (not shown) may be further formed in the emission area EA so as to cover the organic layer 430 and the cathode 426. It is, however, to be understood that the present disclosure is not limited thereto.

A part of the first passivation layer 415a on the second pad electrode 428 located in the emission area EA may be removed, such that a contact hole 414 for exposing the second pad electrode 428 may be formed. Accordingly, the cathode 426 may be electrically connected to the second pad electrode 428 through the contact hole 414.

The first and second pad areas PA1 and PA2 may be located outside the emission area EA. Although the second pad area PA2 is located between the first pad areas PA1 in the example shown in FIG. 15, the present disclosure is not limited thereto.

In addition, FIG. 15 shows an example where the first and second pad areas PA1 and PA2 are located only on one outer side of the emission area EA, but the present disclosure is not limited thereto. In other implementations, the first and second pad areas PA1 and PA2 may be located on both outer sides of the emission area EA. In addition, according to another exemplary aspect of the present disclosure, the first pad area PA1 may be located on one outer side of the emission area EA, and the second pad area PA2 may be located on the other side of the emission area EA.

The organic light-emitting diode unit will be described in more detail. An anode 416 and a cathode 426 are disposed on the substrate 410, and an organic layer 430 is disposed between the anode 416 and the cathode 426 to form an organic light-emitting diode.

In addition, the organic light-emitting diode unit may further include an auxiliary line 411 for supplementing the conductivity of the anode 416, and the first passivation layer 415a for preventing a short-circuit between the anode 416 and the cathode 426.

Specifically, the substrate 410 may be made of transparent glass. In addition, the substrate 410 may be made of a polymer material having a flexibility such as polyimide (PI).

An inner light extraction layer 440 may be disposed on the substrate 410. It is, however, to be understood that the present disclosure is not limited thereto.

On the substrate 410, an anode 416 according to the fourth exemplary aspect may be disposed.

The anode 416 may be formed of indium tin oxide (ITO) or indium zinc oxide (IZO), which is a transparent metal oxide material having a high work function and high conductivity to facilitate injection of holes into the organic layer 430.

The anode 416 may include a first anode 416a in emission zones 405-1, 405-2 and 405-3, and a second anode 416b in a non-emission zone other than the emission zones 405-1, 405-2 and 405-3.

The second anode 416b may be disposed on the auxiliary line 411 to cover it. The first anode 416a may be formed in the emission zones 405-1, 405-2 and 405-3 defined by the auxiliary line 411 in a mesh shape.

In the lighting apparatus 400 according to the fourth exemplary aspect of the present disclosure, Each of short-circuit reduction patterns SR1, SR2 and SR3 is formed on the first anode 416a to which electric current is supplied in a pixel to reflect a narrow path. The short-circuit reduction patterns SR1, SR2 and SR3 are covered with the first passivation layer 415a to prevent a short-circuit in the entire panel. That is to say, the short-circuit reduction patterns SR1, SR2 and SR3 surround the emission zones 405-1, 405-2 and 405-3 of the pixels, respectively. The electric current flowing to a short-circuit occurring area is limited by adding the resistance in each of the pixels.

Each of the short-circuit reduction patterns SR1, SR2 and SR3 may be formed by removing a predetermined part of the first anode 416a and may be filled with insulating materials having different resistances. The first passivation layer 415a may be disposed on the anode 416 including the short-circuit reduction patterns SR1, SR2 and SR3.

The short-circuit reduction patterns SR1, SR2 and SR3 may be in the shape of an open curve surrounding the border of the emission zones 405-1, 405-2 and 405-3, respectively. In addition, each of the short-circuit reduction patterns SR1, SR2 and SR3 may be a combination of straight lines or may include a curved line.

Each of the short-circuit reduction patterns SR1, SR2 and SR3 penetrates the first anode 416a vertically, and may be filled with the insulating materials having different resistances.

On the other hand, the lighting apparatus according to the fourth exemplary aspect is designed such that the resistances of the insulating materials in the short-circuit reduction patterns SR1, SR2 and SR3 in the respective pixels have different values depending on the distance between the respective pixels and the first and second pad electrodes 427 and 428. Specifically, the short-circuit reduction patterns SR1, SR2 and SR3 may be designed so that it is filled with insulating materials having gradually-reducing resistances as the distance between the respective pixels and the first and second pad electrodes 427 and 428 increases.

In the example shown in FIGS. 17 and 18A to 18C, the short-circuit reduction patterns SR1, SR2 and SR3 are designed so that they are filled with the insulating materials having gradually-reducing resistances as the distance between the respective pixels and the first and second pad electrodes 427 and 428 increases, thereby compensating for the voltage drop.

FIG. 17 shows a part of the emission area, e.g., the pixels arranged in a 3-by-3 matrix, and the short-circuit reduction pattern SR1, SR2 or SR3 filled with the insulating material having the same resistance is disposed in each row. It is, however, to be understood that the present disclosure is not limited thereto. The short-circuit reduction patterns SR1, SR2 and SR3 may be filled with insulating materials having different resistances even in the same row.

In addition, FIG. 17 shows an example where the first and second pad areas PA1 and PA2 are located on the upper side, but the present disclosure is not limited thereto.

For example, a first short-circuit reduction pattern SR1 in the shape of an open curve having five straight lines may be formed outside the first emission zone 405-1 of the first row along the four sides of the first emission zone 405-1. A second short-circuit reduction pattern SR2 in the shape of an open curve having five straight lines may be formed outside the second emission zone 405-2 of the second row along the four sides of the second emission zone 405-2. In addition, a third short-circuit reduction pattern SR3 in the shape of an opening having five straight lines along four sides of the third emission zone 405-3 may be formed outside the third emission zone 405-3 in the third row. The shape of the short-circuit reduction patterns SR1, SR2 and SR3 is not limited to those described above.

The first short-circuit reduction pattern SR1 in the first row may be filled with an insulating material having a first resistance, and the second short-circuit reduction pattern SR2 in the second row may be filled with an insulating material having a second resistance smaller than the first resistance. The short-circuit reduction pattern SR3 in the third row may be filled with an insulating material having a third resistance smaller than the first resistance and the second resistance. It is, however, to be understood that the present disclosure is not limited thereto.

As such, according to the fourth exemplary aspect of the present disclosure, the voltage drop that occurs as the distance from the first and second pad electrodes 427 and 428 increases can be compensated, so that the luminance uniformity of the lighting apparatus 400 can be improved. Accordingly, as the luminance uniformity is improved, the lifetime can be elongated and the quality of the exterior can be improved.

The first pad electrode 427 made of the same conductive material as the anode 416 may be disposed on the same layer as the anode 416 in first pad area PA1 of the substrate 410, and the second pad electrode 428 may be disposed in the second pad area PA2.

The anode 416 is made of a transparent metal oxide material such as ITO and thus has the advantage of transmitting emitted light, but has the disadvantage of high electrical resistance as compared with opaque metal materials. Therefore, when the lighting apparatus 400 having a large area is fabricated, the current cannot be applied evenly across the emission zones 405-1, 405-2 and 405-3, such that the lighting apparatus 400 having the large area cannot emit light of uniform luminance.

Accordingly, according to the exemplary aspect of the present disclosure, the auxiliary line 411 made of an opaque metal material is further disposed on the substrate 410, and the anode 416 including the auxiliary line 411 may be disposed on the substrate 410.

The auxiliary line 411 is disposed on the entire emission area EA in a thin mesh shape, a hexagonal shape, an octagonal shape, or a circular shape, to allow a uniform electric current to flow in the first anode 416a of the emission zones 405-1, 405-2 and 405-3 in the entire emission area EA. As a result, the lighting apparatus 400 having a larger area can emit light of uniform luminance.

The auxiliary line 411 may be made of an opaque metal having good conductivity such as Al, Au, Cu, Ti, W and Mo, or an alloy thereof. Although not shown in the drawings, the auxiliary line 411 may have a two-layer structure of an upper auxiliary line and a lower auxiliary line. However, the present disclosure is not limited thereto. It may be made up of a single layer.

The first passivation layer 415a may be stacked in the emission area EA of the substrate 410.

For example, the first passivation layer 415a is shown as a rectangular frame having a generally uniform width in the example shown in FIG. 17. However, the first passivation layer 415a may be formed in a mesh shape so that it covers the auxiliary line 411 disposed in a mesh shape in the emission zones 405-1, 405-2 and 405-3. It is, however, to be understood that the present disclosure is not limited thereto.

The first passivation layer 415a may cover the auxiliary line 411 and the short-circuit reduction patterns SR1, SR2 and SR3 adjacent thereto. In addition, the passivation layer 415a may surround the auxiliary line 411 to reduce the level difference by the auxiliary line 411, so that various layers to be formed in subsequent processes can be reliably formed without being broken.

The first passivation layer 415a may be made of an inorganic material such as SiOx and SiNx.

However, the first passivation layer 415a may be made of an organic material such as photo acryl or may be made up of multiple layers of an inorganic material and an organic material.

The organic layer 430 and the cathode 426 may be disposed on the first passivation layer 415a disposed on the substrate 410. A part of the first passivation layer 415a on the second pad electrode 428 located in the emission area EA may be removed, such that a contact hole 414 for exposing the second pad electrode 428 may be formed. The cathode 426 may be electrically connected to the second pad electrode 428 thereunder through the contact hole 414.

The cathode 426 may be made of a conductive material having a low work function to facilitate injection of electrons into the organic layer 430. Examples of the material of the cathode 426 may include a metal such as magnesium (Mg), calcium (Ca), sodium (Na), titanium (Ti), indium (In), yttrium (Y), lithium (Li), gadolinium (Gd), aluminum (Al), silver (Ag), tin (Sn) and lead (Pb), or an alloy thereof.

The organic layer 430 may be made up of a single stack structure including a red organic emissive layer, a multi-stack tandem structure including a plurality of red organic emissive layers, or a multi-stack tandem structure including red/organic green light-emissive layers and a sky-blue organic emissive layer. It is, however, to be understood that the organic layer 430 of the present disclosure is not limited to the above-described structure, and various structures may be employed.

The second passivation layer 415b and the third passivation layer may be disposed on the substrate 410 on which the cathode 426 is formed.

The second passivation layer 415b is formed to cover the organic layer 430 and the cathode 426 in the emission area EA and may prevent moisture from permeating into the organic layer 430 in the emission area EA.

According to the exemplary aspect of the present disclosure, the second passivation layer 415b and the third passivation layer are formed so as to cover the organic layer 430 and the cathode 426 in the emission area EA in addition to the adhesive layer 460 and the sealing means of the metal film 470, so that it is possible to prevent moisture from permeating into the organic layer 430 of the lighting apparatus 400 in which light is actually emitted and output.

The second passivation layer 415b may be made of an organic material such as photo acryl. The third passivation layer may be made of an inorganic material such as SiOx and SiNx. It is, however, to be understood that the present disclosure is not limited thereto.

An encapsulant may be disposed on the third passivation layer. Such an encapsulant may include an epoxy compound, an acrylate compound, an acrylic compound, or the like.

As described above, on the substrate 410 in the first pad area PA1, the first pad electrode 427 connected to the anode 416 may be exposed to the outside. In the second pad area PA2 of the substrate 410, the second pad electrode 428 electrically connected to the cathode 426 through the contact hole 414 may be exposed to the outside. Accordingly, the first pad electrode 427 and the second pad electrode 428 are electrically connected to an external power source to apply current to the anode 416 and the cathode 426, respectively.

The adhesive layer 460 such as a pressure-sensitive adhesive (PSA) may be disposed on the third passivation layer, and the metal film 470 may be disposed on the adhesive layer 460 so that the metal film 470 is attached to the third passivation layer. As a result, the lighting apparatus 400 can be sealed.

The adhesive layer 460 may be formed of a photo-curable adhesive or a thermosetting adhesive.

For example, the adhesive layer 460 may be implemented as a pressure sensitive adhesive (PSA) for attaching the metal film 470 to the organic light-emitting diode unit. The thickness of the adhesive layer 460 may be approximately 30 μm. It is, however, to be understood that the present disclosure is not limited thereto, and the thickness may vary depending on the design choice of the lighting apparatus 400.

The metal film 470 is disposed on the adhesive layer 460 and serves to maintain the rigidity of the lighting apparatus 400. To this end, the metal film 470 may be made of copper having a thickness of approximately 20 μm. It is, however, to be understood that the present disclosure is not limited thereto. The metal film 470 may be modified depending on the design choice of the lighting apparatus 400.

The adhesive layer 460 and the sealing means of the metal film 470 can be attached so that the second passivation layer 415b and the third passivation layer are covered sufficiently.

In addition, the protective film 475 may be attached to the entire surface of the emission area EA of the substrate 410 except for the pad areas PA1 and PA2.

That is to say, the protective film 475 may be disposed on the metal film 470 to absorb external impact to protect the lighting apparatus 400. To this end, the protective film 475 may be implemented as a polyethylene terephthalate (PET) having a thickness of approximately 100 μm, which is a polymer film. It is, however, to be understood that the present disclosure is not limited thereto, but the protective film 475 may be modified depending on the design choice of the lighting apparatus 400.

The exemplary aspects of the present disclosure can also be described as follows:

According to an aspect of the present disclosure, there is provided a lighting apparatus using organic light-emitting diodes. The lighting apparatus using organic light-emitting diodes includes an anode disposed in an emission area of a substrate; first and second pad electrodes disposed on an outer side of the emission area of the substrate; a short-circuit reduction pattern configured by removing a predetermined part of the anode and surrounding an emission zone of each of pixels; a passivation layer comprising the short-circuit reduction pattern and disposed on the anode; an organic layer and a cathode disposed on the passivation layer in the emission area of the substrate; and a metal film disposed in the emission area of the substrate, wherein the short-circuit reduction pattern has a gradually-reducing resistance as a distance between the respective pixels and the first and second pad electrodes increases.

The lighting apparatus using organic light-emitting diodes may further include an auxiliary line disposed on the substrate, wherein the anode may be disposed on the substrate and comprises the auxiliary line.

The passivation layer may be disposed on and covers the auxiliary line.

The first pad electrode may be connected to the anode, and the second pad electrode may be connected to the cathode.

The short-circuit reduction pattern may be disposed to surround a border of the emission zone to add the resistance to each of the pixels, thereby limiting an electric current flowing to a short-circuit occurring area.

The short-circuit reduction pattern may be in a shape of an open curve surrounding the border of the emission zone.

The short-circuit reduction pattern may penetrate the anode vertically and may be filled with the passivation layer.

The open curve of the short-circuit reduction pattern may have a gradually-reducing length as the distance between the respective pixels and the first and second pad electrodes increases, thereby compensating for a voltage drop (IR drop).

The open curve of the short-circuit reduction pattern may have a gradually-reducing width as the distance between the respective pixels and the first and second pad electrodes increases, thereby compensating for a voltage drop.

The lighting apparatus using organic light-emitting diodes may further include an insulating material, wherein the short-circuit reduction pattern may be filled with the insulating material.

The short-circuit reduction pattern may be filled with the insulating material having a gradually-reducing resistance as the distance between the respective pixels and the first and second pad electrodes increases, thereby compensating for a voltage drop.

According to another aspect of the present disclosure, there is provided a lighting apparatus using organic light-emitting diodes. The lighting apparatus using organic light-emitting diodes includes an anode disposed in an emission area of a substrate; first and second pad electrodes disposed on an outer side of the emission area of the substrate; a short-circuit reduction pattern configured by removing a predetermined part of the anode and surrounding an emission zone of each of pixels; a passivation layer comprising the short-circuit reduction pattern and disposed on the anode; an organic layer and a cathode disposed on the passivation layer in the emission area of the substrate; and a metal film disposed in the emission area of the substrate, wherein the short-circuit reduction pattern has different resistances depending on a distance between the respective pixels and the first and second pad electrodes to compensate for a voltage drop due to the distance.

The short-circuit reduction pattern may be in a shape of an open curve surrounding the border of the emission zone.

The short-circuit reduction pattern may penetrate the anode vertically and may be filled with the passivation layer.

The open curve of the short-circuit reduction pattern may have a gradually-reducing length as the distance between the respective pixels and the first and second pad electrodes increases.

The open curve of the short-circuit reduction pattern may have a gradually-reducing width as the distance between the respective pixels and the first and second pad electrodes increases.

The lighting apparatus using organic light-emitting diodes may further include an insulating material, wherein the short-circuit reduction pattern may be filled with the insulating material.

The short-circuit reduction pattern may be filled with the insulating material having a gradually-reducing resistance as the distance between the respective pixels and the first and second pad electrodes increases.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A lighting apparatus including organic light-emitting diodes comprising:
   an anode disposed in an emission area of a substrate;
   first and second pad electrodes disposed on an outer side of the emission area of the substrate;
   a short-circuit reduction pattern surrounding an emission zone of each of pixels and formed by removing a part of the anode;
   a passivation layer comprising the short-circuit reduction pattern and disposed on the anode;
   an organic layer and a cathode disposed on the passivation layer in the emission area of the substrate; and
   a metal film disposed in the emission area of the substrate, wherein the short-circuit reduction pattern has a gradually-reducing resistance with an increased distance between the pixels and the first and second pad electrodes.

2. The apparatus of claim 1, further comprising an auxiliary line disposed on the substrate.

3. The apparatus of claim 2, wherein the anode is disposed on the substrate and the auxiliary line.

4. The apparatus of claim 2, wherein the passivation layer is disposed on and covers the auxiliary line.

5. The apparatus of claim 1, wherein the first pad electrode is connected to the anode, and the second pad electrode is connected to the cathode.

6. The apparatus of claim 1, wherein the short-circuit reduction pattern functions to limit an electric current flowing to a short-circuit occurring area.

7. The apparatus of claim 1, wherein the short-circuit reduction pattern is disposed to surround a border of the emission zone and adds the resistance to each of the pixels.

8. The apparatus of claim 7, wherein the short-circuit reduction pattern has an open curve shape surrounding the border of the emission zone.

9. The apparatus of claim 7, wherein the short-circuit reduction pattern vertically penetrates the anode and is filled with the passivation layer.

10. The apparatus of claim 7, wherein the open curve of the short-circuit reduction pattern has a gradually-reducing length with the increased distance between the pixels and the first and second pad electrodes and compensates for a voltage drop.

11. The apparatus of claim 7, wherein the open curve of the short-circuit reduction pattern has a gradually-reducing width as the increased distance between the pixels and the first and second pad electrodes and compensates for a voltage drop.

12. The apparatus of claim 1, further comprising an insulating material, and the short-circuit reduction pattern is filled with the insulating material.

13. The apparatus of claim 12, wherein the insulating material having a gradually-reducing resistance as the increased distance between the pixels and the first and second pad electrodes and compensates for a voltage drop.

14. A lighting apparatus using organic light-emitting diodes comprising:
   an anode disposed in an emission area of a substrate;
   first and second pad electrodes disposed at an outer side of the emission area of the substrate;
   a short-circuit reduction pattern surrounding an emission zone of each of pixels and configured by removing a part of the anode;
   a passivation layer disposed on the anode and the short-circuit reduction pattern;
   an organic layer and a cathode disposed on the passivation layer in the emission area of the substrate; and
   a metal film disposed in the emission area of the substrate,
   wherein the short-circuit reduction pattern has different resistances varying with a distance between the pixels and the first and second pad electrodes and compensates for a voltage drop.

15. The apparatus of claim 14, wherein the short-circuit reduction pattern has an open curve shape surrounding a border of the emission zone.

16. The apparatus of claim 15, wherein the short-circuit reduction pattern vertically penetrates the anode and is filled with the passivation layer.

17. The apparatus of claim 15, wherein the open curve of the short-circuit reduction pattern has a gradually-reducing length with an increased distance between the respective pixels and the first and second pad electrodes.

18. The apparatus of claim 15, wherein the open curve of the short-circuit reduction pattern has a gradually-reducing width with an increased distance between the respective pixels and the first and second pad electrodes.

19. The apparatus of claim 14, further comprising an insulating material, and the short-circuit reduction pattern is filled with the insulating material.

20. The apparatus of claim 19, wherein the short-circuit reduction pattern is filled with the insulating material having a gradually-reducing resistance with an increased distance between the pixels and the first and second pad electrodes.

* * * * *